United States Patent
Sugiura et al.

(10) Patent No.: US 8,785,231 B2
(45) Date of Patent: Jul. 22, 2014

(54) METHOD OF MAKING SEMICONDUCTOR DEVICE

(71) Applicant: DENSO CORPORATION, Kariya (JP)

(72) Inventors: Kazuhiko Sugiura, Nagoya (JP); Tetsuo Fujii, Toyohashi (JP); Hisanori Yokura, Obu (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 13/748,734

(22) Filed: Jan. 24, 2013

(65) Prior Publication Data

US 2013/0178008 A1    Jul. 11, 2013

Related U.S. Application Data

(62) Division of application No. 12/654,002, filed on Dec. 8, 2009, now abandoned.

(30) Foreign Application Priority Data

Dec. 23, 2008  (JP) ................................. 2008-326672

(51) Int. Cl.
*H01L 21/00* (2006.01)
*H01L 29/84* (2006.01)

(52) U.S. Cl.
USPC .. 438/51; 257/254; 257/E23.18; 257/E29.324

(58) Field of Classification Search
USPC ......... 257/254, 415, 433, 678, 704, 710, 779,
257/E23.18, E23.193, E21.5, E23.181,
257/E29.324, 414, 684; 438/50, 118, 121,
438/124–125, 127, 48, 49, 51, 106
See application file for complete search history.

(56) References Cited

U.S. PATENT DOCUMENTS

| | | | |
|---|---|---|---|
| 5,461,916 A | 10/1995 | Fujii et al. | |
| 5,756,901 A | 5/1998 | Kurle et al. | |
| 6,140,210 A | 10/2000 | Aga et al. | |
| 6,240,782 B1 | 6/2001 | Kato et al. | |
| 6,405,592 B1 | 6/2002 | Murari et al. | |
| 6,875,672 B2 | 4/2005 | Nemoto et al. | |
| 6,979,873 B2 | 12/2005 | Fujii | |
| 7,859,091 B2 | 12/2010 | Fujii et al. | |
| 2003/0183009 A1* | 10/2003 | An et al. | 73/514.16 |
| 2005/0262929 A1 | 12/2005 | Felton et al. | |
| 2006/0131699 A1 | 6/2006 | Raab et al. | |

(Continued)

FOREIGN PATENT DOCUMENTS

| | | |
|---|---|---|
| JP | 10-104260 A | 4/1998 |
| JP | 11-145438 A | 5/1999 |
| JP | 2004-333133 A | 11/2004 |
| JP | 2006-351591 A | 12/2006 |
| JP | 2007-171040 A | 7/2007 |

*Primary Examiner* — William F Kraig
*Assistant Examiner* — Khaja Ahmad
(74) *Attorney, Agent, or Firm* — Posz Law Group, PLC

(57) ABSTRACT

A semiconductor device includes a sensor portion, a cap portion, and an ion-implanted layer. The sensor portion has a sensor structure at a surface portion of a surface. The cap portion has first and second surfaces opposite to each other and includes a through electrode. The surface of the sensor portion is joined to the first surface of the cap portion such that the sensor structure is sealed between the sensor portion and the cap portion. The ion-implanted layer is located on the second surface of the cap portion. The through electrode extends from the first surface to the second surface and is exposed through the ion-implanted layer.

16 Claims, 17 Drawing Sheets

(56) References Cited

U.S. PATENT DOCUMENTS

| | | |
|---|---|---|
| 2007/0042521 A1 | 2/2007 | Yama |
| 2008/0009091 A1* | 1/2008 | Felton et al. .................... 438/51 |
| 2008/0042260 A1 | 2/2008 | Jeong et al. |
| 2008/0067664 A1* | 3/2008 | Lim et al. ...................... 257/690 |
| 2008/0099862 A1* | 5/2008 | Fujii et al. .................... 257/417 |
| 2008/0237806 A1 | 10/2008 | Uchiyama |
| 2008/0251866 A1 | 10/2008 | Belt et al. |
| 2008/0290490 A1 | 11/2008 | Fujii et al. |
| 2009/0186446 A1 | 7/2009 | Kwon et al. |

* cited by examiner

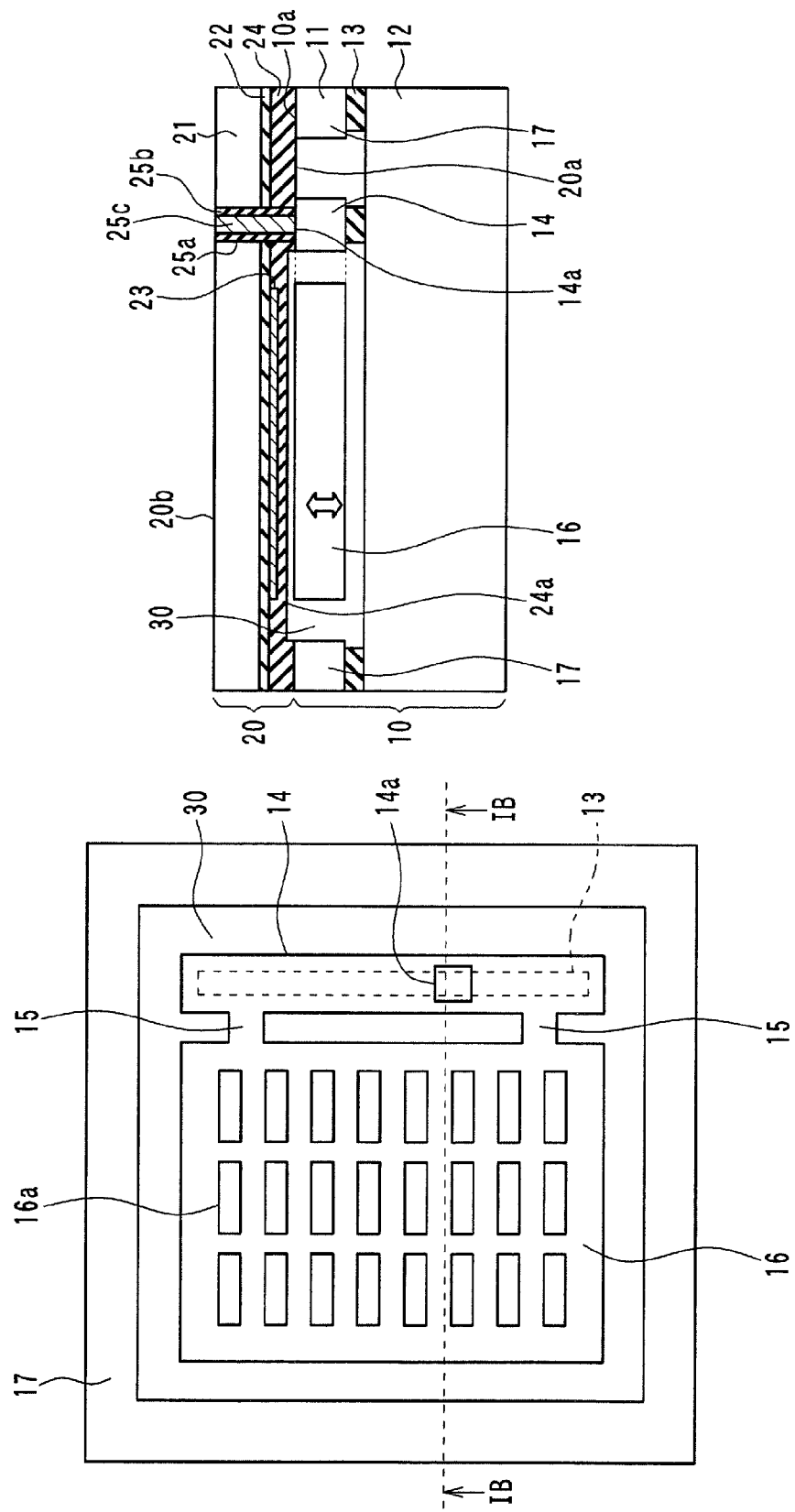

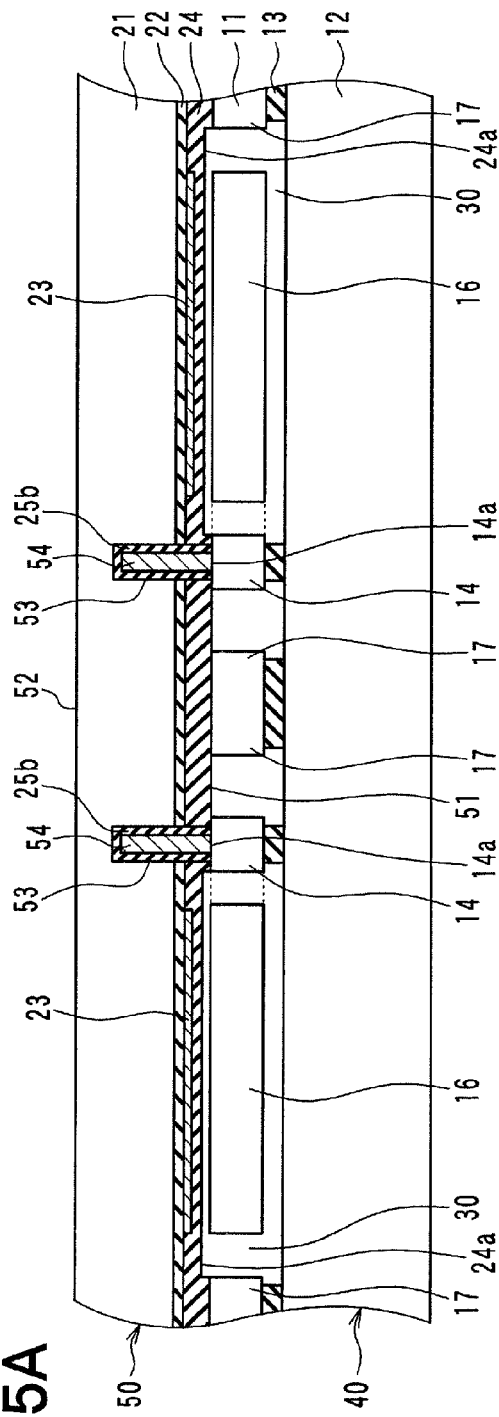
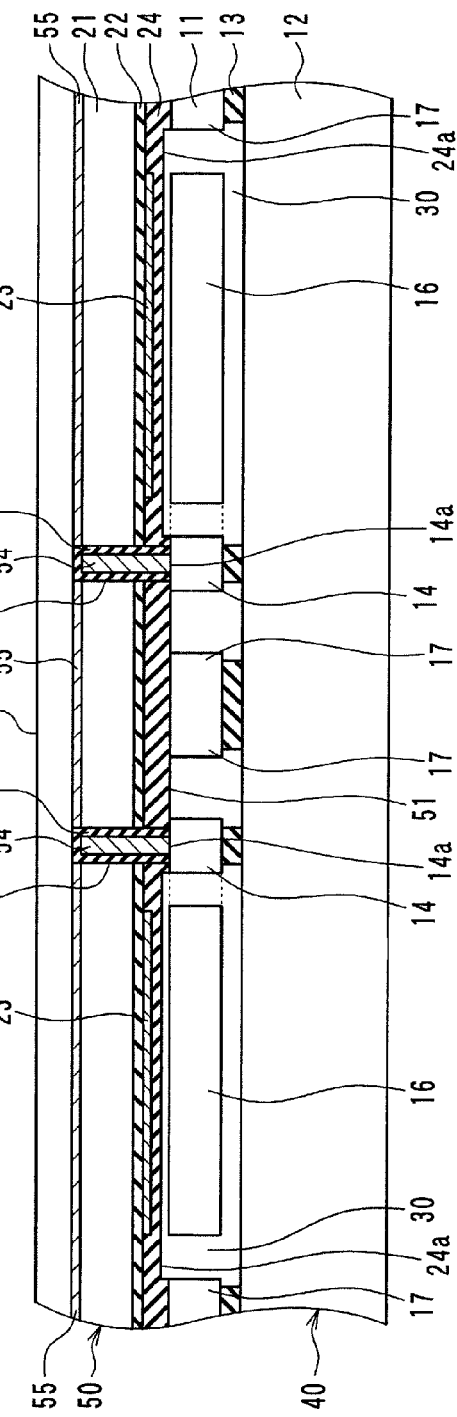

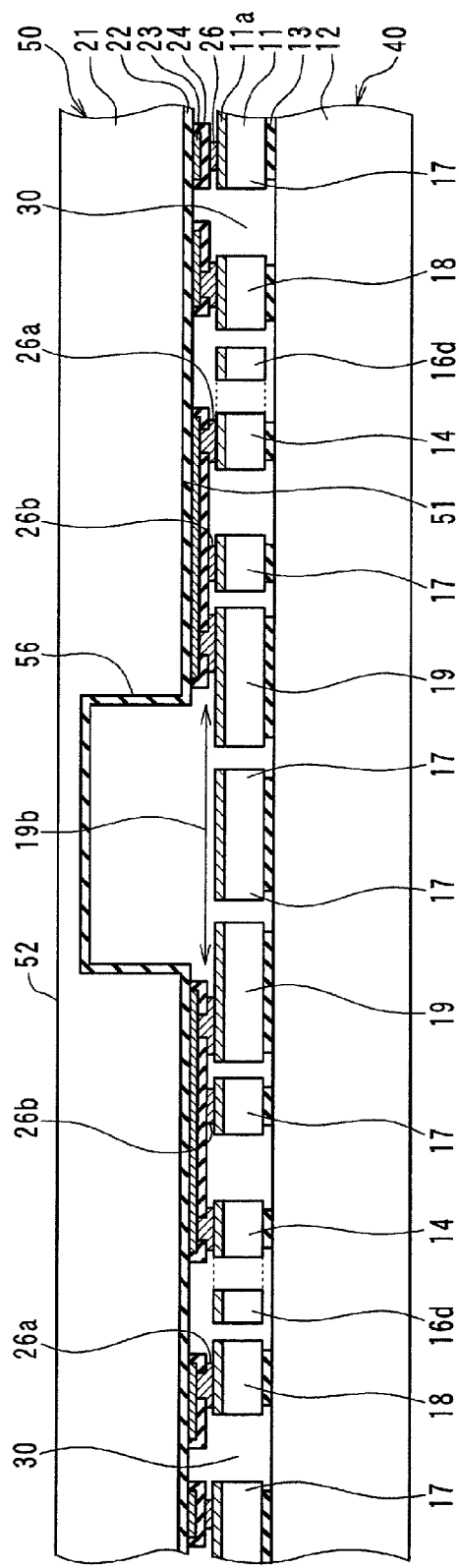
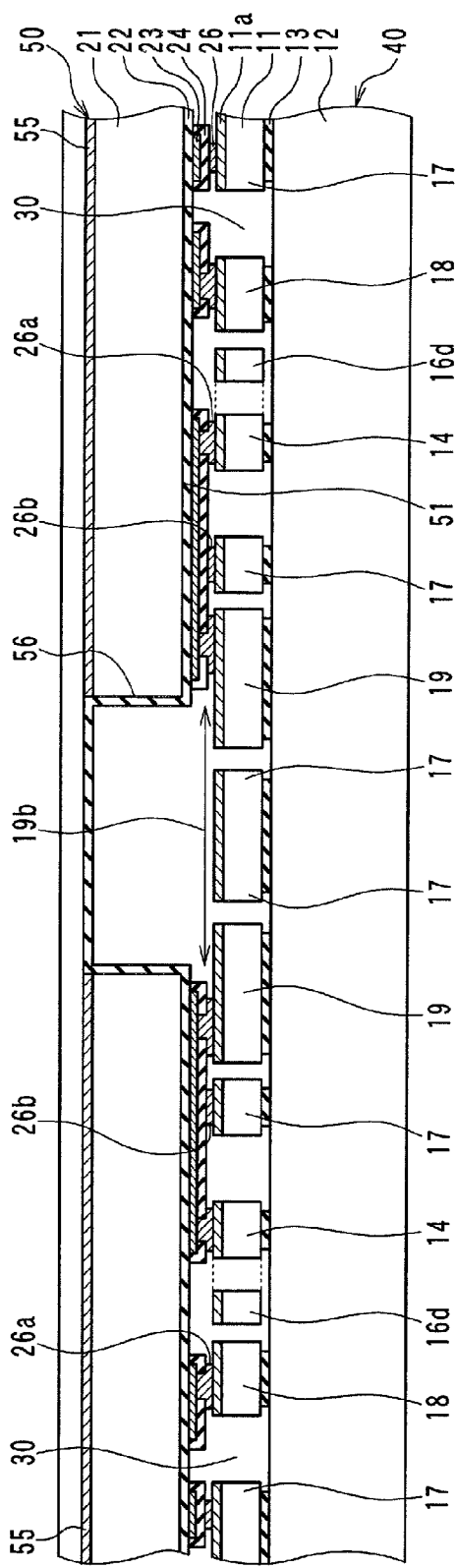

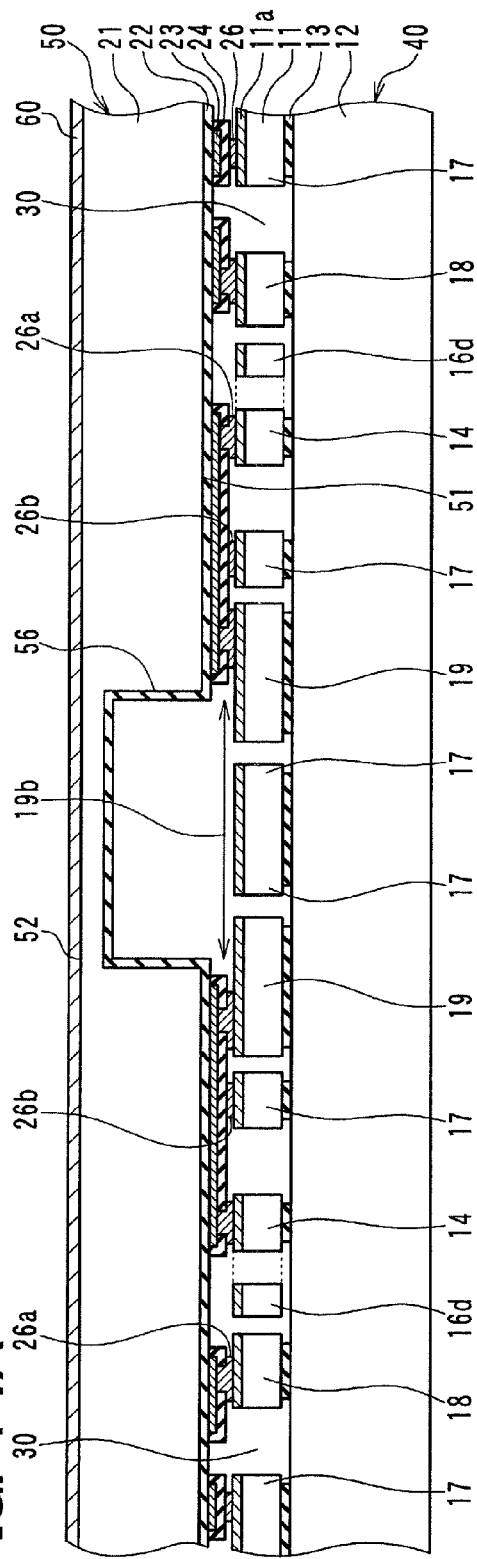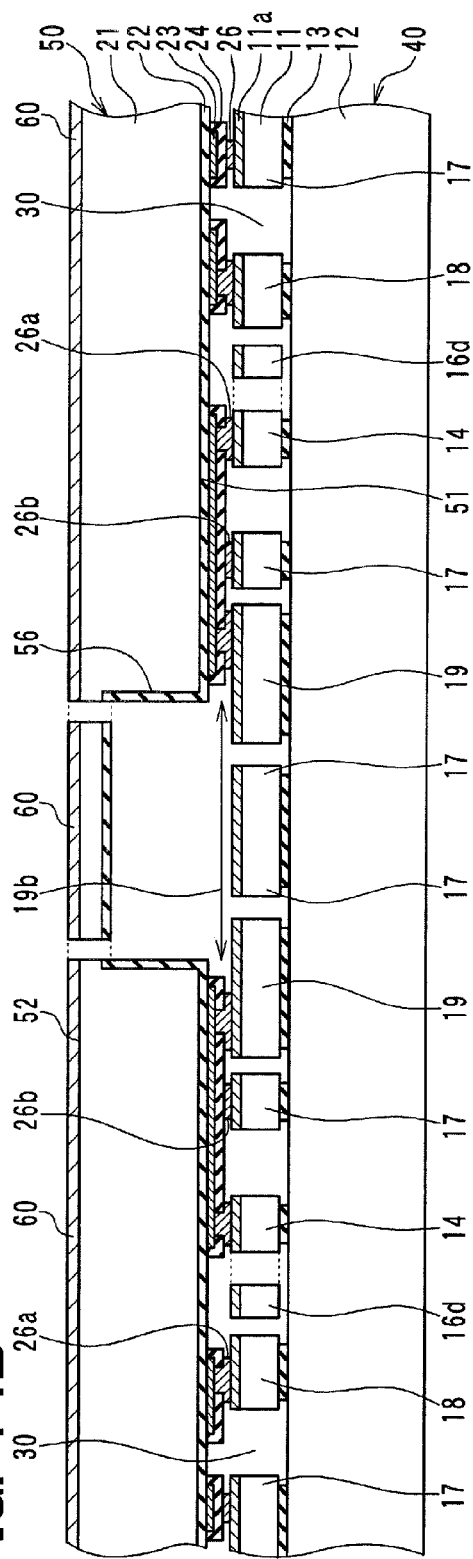

METHOD OF MAKING SEMICONDUCTOR DEVICE

CROSS REFERENCE TO RELATED APPLICATION

This application is a divisional of U.S. application Ser. No. 12/654,002 filed on Dec. 8, 2009, which is based on and claims priority to Japanese Patent Application No. 2008-326672 filed on Dec. 23, 2008, the disclosures of which are incorporated herein by reference.

FIELD OF THE INVENTION

The present invention relates to a semiconductor device in which an integrated circuit (e.g., LSI circuit) or a device having a movable portion such as a semiconductor mechanical sensor (e.g., acceleration sensor), an angular rate sensor (e.g., gyro sensor), or a MEMS oscillator is protected with a cap. The present invention also relates to a method of making the semiconductor device.

BACKGROUND OF THE INVENTION

JP-2004-333133A discloses an inertial sensor having a device layer where a movable portion is formed. The device layer is sandwiched between upper and lower substrates so that the movable portion of the device layer can be sealed by the upper and lower substrates. The upper substrate serves as a cap for covering the movable portion and prevents entry of a foreign matter such as water into the movable portion.

The upper substrate has a through hole where the device layer is exposed. A pad formed in the device layer is exposed through the through hole, and a bonding wire is directly connected to the exposed pad so that the device layer can be electrically connected to external circuitry.

Such an inertial sensor is manufactured as follows. Firstly, the device layer and the lower substrate are joined together, and the movable portion is formed in the device layer. Then, the upper substrate having the through hole is joined to the device layer in such a manner that the through hole of the upper substrate can be aligned with the pad of the device layer. Then, the bonding wire is connected to the pad that is exposed through the through hole.

The through hole of the upper substrate is sized to be large enough to prevent the bonding wire from touching the upper substrate. Therefore, there is a problem that a chip size becomes large due to the large through hole. Further, there is another problem that a surface area of the upper substrate becomes small due to the large through hole. Accordingly, strength of the upper substrate is reduced, and there arises a difficulty in handling such as holding and carrying the upper substrate.

SUMMARY OF THE INVENTION

In view of the above, it is an object of the present invention to provide a semiconductor device having a structure for improving a handling of a cap and for reducing a size of the semiconductor device. It is another object of the present invention to provide a method of making the semiconductor device.

According to a first aspect of the present invention, a method of making a semiconductor device includes preparing a sensor wafer having one side and including a plurality of sensor portions. Each sensor portion has one surface on the side of the sensor wafer and includes a sensor structure at a surface portion of the surface. The method further includes preparing a cap wafer having a front side and a back side opposite to the front side and including a plurality of cap portions. Each cap portion has a first surface on the front side of the cap wafer and a second surface on the back side of the cap wafer. The method further includes forming a trench on the first surface of the cap portion, forming an insulation layer on a wall of the trench, and forming a buried electrode on the insulation layer. The method further includes joining the side of the sensor wafer to the front side of the cap wafer such that the buried electrode of the cap portion is electrically connected to a contact region of the sensor structure of the sensor portion and such that the sensor structure is sealed between the sensor portion and the cap portion. The method further includes forming a through hole and a through electrode extending from the first surface to the second surface of the cap portion by removing the back side of the cap wafer until the trench and the buried electrode are exposed to a new surface of the back side of the cap wafer. The method further includes dividing a joined body of the sensor wafer and the cap wafer into a plurality of semiconductor devices in the form of chips after the forming of the through electrode.

According to a second aspect of the present invention, a method of making a semiconductor device includes preparing a sensor wafer having one side and including a plurality of sensor portions. Each sensor portion has one surface on the side of the sensor wafer and includes a sensor structure at a surface portion of the surface and a connection portion electrically connected to the sensor structure. The connection portion is located within a connection region on an outer region of the surface. The connection region of a first one of the plurality sensor portions faces the connection region of a second one of the plurality of sensor portions to form a cavity region between the sensor structure of the first one of the plurality sensor portions and the sensor structure of the second one of the plurality sensor portions. The method further includes preparing a cap wafer having a front side and a back side opposite to the front side and including a plurality of cap portions. Each cap portion has a first surface on the front side of the cap wafer and a second surface on the back side of the cap wafer. The method further includes forming a recessed portion on the front side of the cap wafer. The method further includes joining the side of the sensor wafer to the front side of the cap wafer such that the cavity region of the sensor wafer is covered with a bottom of the recessed portion of the cap wafer and such that the sensor structure is sealed between the sensor portion and the cap portion. The method further includes forming an ion-implanted layer in the cap wafer by implanting a plurality of ions into the back side of the cap wafer. The ion-implanted layer is located at a depth equal to or greater than the bottom of the recessed portion measured from the back side of the cap wafer. The method further includes thermally treating a joined body of the sensor wafer and the cap wafer after the forming of the ion-implanted layer. The method further includes separating the back side of the cap wafer with respect to the ion-implanted layer as a cleavage surface to remove the bottom of the recessed portion after the thermally treating of the joined body, so that the cavity region is exposed to a new surface of the back side of the cap wafer through the recessed portion. The method further includes dividing the joined body of the sensor wafer and the cap wafer into a plurality of semiconductor devices in the form of chips after the separating of the back side, so that the connection region of the sensor portion is exposed through the cap portion.

According to a third aspect of the present invention, a method of making a semiconductor device includes preparing a sensor wafer having one side and including a plurality of sensor portions. Each sensor portion has one surface on the side of the sensor wafer and including a sensor structure at a surface portion of the surface and a connection portion electrically connected to the sensor structure. The connection portion is located within a connection region on an outer region of the surface. The connection region of a first one of the plurality of sensor portions faces the connection region of a second one of the plurality of sensor portions to form a cavity region between the sensor structure of the first one of the plurality sensor portions and the sensor structure of the second one of the plurality sensor portions. The method further includes preparing a cap wafer having a front side and a back side opposite to the front side and including a plurality of cap portions. Each cap portion has a first surface on the front side of the cap wafer and a second surface on the back side of the cap wafer. The method further includes forming a recessed portion on the front side of the cap wafer. The method further includes joining the side of the sensor wafer to the front side of the cap wafer such that the cavity region of the sensor wafer is covered with a bottom of the recessed portion of the cap wafer and such that the sensor structure is sealed between the sensor portion and the cap portion. The method further includes etching the back side of the cap wafer to remove the bottom of the recessed portion of the cap wafer, so that the cavity region is exposed to a new surface of the back side of the cap wafer through the recessed portion. The method further includes dividing a joined body of the sensor wafer and the cap wafer into a plurality of semiconductor devices in the form of chips after the separating of the back side, so that the connection region of the sensor portion is exposed through the cap portion.

According to a fourth aspect of the present invention a semiconductor device includes a sensor portion, a cap portion, and an ion-implanted layer. The sensor portion has one surface and including a sensor structure at a surface portion of the surface and a connection portion electrically connected to the sensor structure. The cap portion has a first surface and a second surface opposite to the first surface. The cap portion includes a through hole extending from the first surface to the second surface, an insulation layer formed on a wall of the through hole, and a through electrode formed on the insulation layer. The through electrode extends from the first surface to the second surface through the through hole and electrically connected to the connection portion of the sensor portion. The ion-implanted layer is disposed on the second surface of the cap portion. The surface of the sensor portion is joined to the first surface of the cap portion such that the sensor structure is sealed between the sensor portion and the cap portion. The through electrode is exposed through the ion-implanted layer.

According to a fifth aspect of the present invention, a semiconductor device includes a sensor portion, a cap portion, and an ion-implanted layer. The sensor portion has one surface and includes a sensor structure at a surface portion of the surface and a connection portion electrically connected to the sensor structure. The connection portion is located within a connection region on an outer region of the surface. The cap portion has a first surface and a second surface opposite to the first surface. The ion-implanted layer is disposed on the second surface of the cap portion. The surface of the sensor portion is joined to the first surface of the cap portion such that the sensor structure is sealed between the sensor portion and the cap portion and such that the connection region is exposed through the cap portion.

BRIEF DESCRIPTION OF THE DRAWINGS

The above and other objectives, features and advantages of the present invention will become more apparent from the following detailed description made with check to the accompanying drawings. In the drawings:

FIG. 1A is a diagram illustrating a plan view of a semiconductor device according to a first embodiment of the present invention, and FIG. 1B is a diagram illustrating a cross-sectional view taken along the line IB-IB in FIG. 1A;

FIGS. 5A and 5B are diagrams illustrating processes following the processes of FIGS. 4A-4C;

FIGS. 11A and 11B are diagrams illustrating processes following the processes of FIGS. 10A-10D;

FIGS. 14A and 14B are diagrams illustrating processes of a method of making a semiconductor device according to a seventh embodiment of the present invention;

Figure 2A:
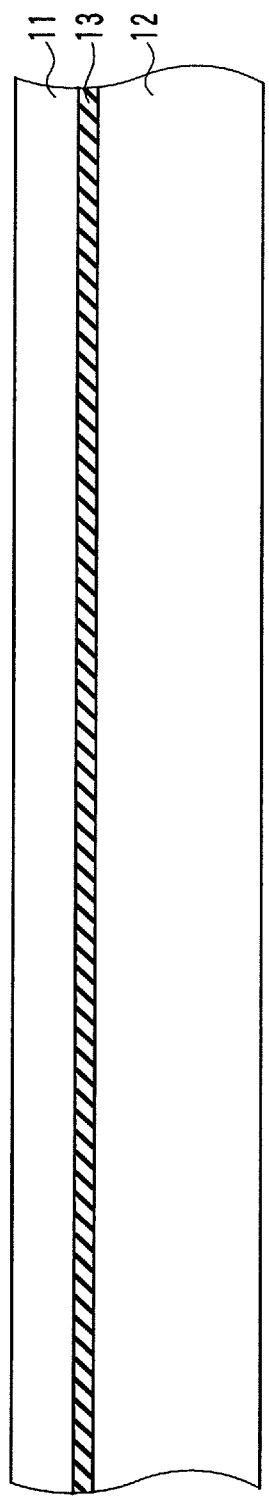
FIGS. 2A and 2B are diagrams illustrating processes of a method of making the semiconductor device according to the first embodiment.

DETAILED DESCRIPTION OF THE PREFERRED EMBODIMENTS (First Embodiment)

A semiconductor device according to a first embodiment of the present invention is described below with reference to FIGS. 1A and 1B. The semiconductor device is a physical quantity sensor having a movable portion such as an acceleration sensor, an angular rate sensor (i.e., gyro sensor), or the like. For example, the semiconductor device can be configured to detect an acceleration or an angular rate of a vehicle. In the first embodiment, the semiconductor device is configured to detect acceleration in a direction perpendicular to a surface of a substrate of the semiconductor device.

FIG. 1A is a plan view of the semiconductor device, and FIG. 1B is a cross-sectional view taken along the line IB-IB in FIG. 1A. While FIG. 1A mainly depicts a sensor portion 10 of the semiconductor device, FIG. 1B depicts an overall view of the semiconductor device.

As shown in FIG. 1B, the semiconductor device includes the sensor portion 10 and a cap portion 20 stacked on the sensor portion 10. The sensor portion 10 is shaped like a plate and has one surface 10a. The cap portion 20 is shaped like a plate and has first and second surfaces 20a, 20b opposite to each other. The surface 10a of the sensor portion 10 is joined to the first surface 20a of the cap portion 20 to form the semiconductor device.

Firstly, the sensor portion 10 is discussed. The sensor portion 10 has a sensing portion for detecting a physical quantity such as an acceleration. As shown in FIG. 1B, the sensor portion 10 is formed with a silicon-on-insulator (SOI) substrate in which an insulation layer 13 is sandwiched between a first silicon layer 11 and a second silicon layer 12. For example, each of the first and second silicon layers 11, 12 can be made of N-type monocrystalline silicon, and the insulation layer 13 can be made of silicon dioxide ($SiO_2$). Alternatively, a metal layer such as an aluminum layer can be formed on a surface of the first silicon layer 11.

The sensing portion is formed by pattering the first silicon layer 11 of the SOI substrate. Specifically, as shown in FIG. 1A, an anchor portion 14, a beam portion 15, an oscillator 16, and a peripheral portion 17 are formed in the first silicon layer 11 by microelectromechanical system (MEMS) techniques.

The anchor portion 14 supports the oscillator 16 so that the oscillator 16 can be spaced from the second silicon layer 12. Thus, the oscillator 16 is suspended above the second silicon layer 12. The anchor portion 14 is shaped like a block and located on the insulation layer 13. The anchor portion 14 has a contact region 14a and is electrically connected to external circuitry through the contact region 14a.

The beam portion 15 couples the anchor portion 14 to the oscillator 16 and has a spring characteristic. The anchor portion 14 and the oscillator 16 are integrally coupled together by the beam portion 15 so that the oscillator 16 can be supported by the anchor portion 14. Thus, as shown in FIG. 1B, the oscillator 16 is suspended above the second silicon layer 12 so that there can be a predetermined space between the second silicon layer 12 and the oscillator 16. In the first embodiment, the anchor portion 14 and the oscillator 16 are coupled together by two beam portions 15.

The oscillator 16 serves as a weight that vibrates in a direction perpendicular to a planar direction of the first silicon layer 11 according to external force such as an acceleration or an angular rate applied to the semiconductor device. The oscillator 16 has multiple etching holes 16a that penetrate the first silicon layer 11 in a stack direction in which the sensor portion 10 and the cap portion 20 are stacked. For example, each etching hole 16a can have a rectangular shape. The etching hole 16a is used as an insertion hole for an etching agent to remove the insulation layer 13 between the second silicon layer 12 and the oscillator 16.

A structure formed with the anchor portion 14, the beam portion 15, and the oscillator 16 is hereinafter defined as a sensor structure.

The peripheral portion 17 is joined to the cap portion 20 and surrounds the entire periphery of the sensor structure. The peripheral portion 17 is fixed on the insulation layer 13.

A surface of the first silicon layer 11 corresponding to the sensor structure and the peripheral portion 17 is the surface 10a of the sensor portion 10. The surface 10a of the sensor portion 10 is joined to the cap portion 20.

Next, the cap portion 20 is discussed. The cap portion 20 prevents entry of foreign matters such as water and dust into the sensor structure. Further, the cap portion 20 forms a sealed space between the sensor portion 10 and the cap portion 20.

As shown in FIG. 1B, the cap portion 20 includes a silicon substrate 21, a first insulation layer 22, a wiring layer 23, and a second insulation layer 24.

The silicon substrate 21 has a facing surface that faces the sensor portion 10. The first insulation layer 22 is formed on the entire facing surface of the silicon substrate 21. The first insulation layer 22 electrically insulates the wiring layer 23 from the silicon substrate 21.

The wiring layer 23 is formed on the first insulation layer 22. As shown in FIG. 1B, the wiring layer 23 is formed in a position corresponding to the oscillator 16. Thus, a capacitor having an upper electrode (i.e., fixed electrode) formed by the wiring layer 23 and a lower electrode (i.e., movable electrode) formed by the oscillator 16 is provided.

The second insulation layer 24 is formed on the first insulation layer 22 to cover the wiring layer 23. The second insulation layer 24 has a recessed portion 24a in a position facing the oscillator 16. The recessed portion 24a prevents the oscillator 16 from touching the second insulation layer 24, even when the oscillator 16 vibrates in the stack direction in which the sensor portion 10 and the cap portion 20 are stacked. Therefore, the oscillator 16 can vibrate in a direction indicated by an arrow in FIG. 1B, i.e., in a direction perpendicular to the surface 10a of the sensor portion 10.

For example, the first insulation layer 22 and the second insulation layer 24 can be made of an insulating material such as silicon dioxide ($SiO_2$) or silicon nitride ($Si_3N_4$). For example, the wiring layer 23 can be made of a conductive material such as aluminum (Al) or polysilicon.

A surface of the second insulation layer 24 is directly joined to the peripheral portion 17 and a part of the anchor portion 14 of the sensor portion 10. Thus, the sensor structure is sealed by the second silicon layer 12, the insulation layer 13, and the peripheral portion 17 of the sensor portion 10 and the second insulation layer 24 of the cap portion 20. That is, the sensor portion 10 and the cap portion 20 form a sealed space 30 therebetween, and the sensor structure is sealed in the sealed space 30.

The sealed space 30 can be filled with a sealing media to achieve an effect of damping on the oscillator 16. For example, the sealed space 30 can be filled with air, nitrogen ($N_2$) gas, or an inert gas such as helium (He) gas, argon (Ar) gas, or the like. To increase the effect of damping, the sealed space 30 can be at 1 atmospheric pressure or more.

In the first embodiment, the surface of the second insulation layer 24 is the first surface 20a of the cap portion 20. In contrast, a surface of the silicon substrate 21 of the cap portion 20 opposite to the facing surface, on which the first insulation layer 22 is formed, is the second surface 20b of the cap portion 20. The second surface 20b of the cap portion 20 is a cleavage surface. Therefore, the second surface 20b of the cap portion 20 is smooth rather than rough.

Further, as shown in FIG. 1B, the cap portion 20 has a through hole 25a that penetrates the silicon substrate 21, the first insulation layer 22, and the second insulation layer 24. An insulation layer 25b such as a $SiO_2$ layer is formed on a wall of the through hole 25a, and a through electrode 25c such as an aluminum electrode is formed on the insulation layer 25b.

A first end of the through electrode 25c is electrically connected to the contact region 14a of the anchor portion 14. A second end of the through electrode 25c is exposed through the second surface 20b of the cap portion 20. Thus, a potential of the anchor portion 14 can be transmitted to the second surface 20b of the cap portion 20 through the through electrode 25c.

Although not shown in the drawings, the wiring layer 23 is electrically connected to a through electrode that is formed to the cap portion 20. Thus, a potential of the wiring layer 23 can be transmitted to the second surface 20b of the cap portion 20.

Below, a method of making the semiconductor device shown in FIGS. 1A and 1B is discussed with reference to FIGS. 2A-6. Each of FIGS. 2A-6 corresponds to a cross-sectional view taken along the line IB-IB in FIG. 1A. Although multiple sensor portions 10 and multiple cap portions 20 are formed in a wafer, FIGS. 2A-6 depict two of the multiple sensor portions 10 and two of the multiple cap portions 20.

Firstly, in a process shown in FIG. 2A, the SOI substrate is prepared. Specifically, for example, a N-type monocrystalline silicon substrate as the second silicon layer 12 is prepared. Then, a $SiO_2$ layer as the insulation layer 13 is formed on the surface of the second silicon layer 12 by thermal oxidation or chemical-vapor deposition (CVD).

Further, a N-type monocrystalline silicon substrate as the first silicon layer 11 is prepared, and the first silicon layer 11 is directly joined to a front surface of the insulation layer 13. Then, the surface of the first silicon layer 11 is polished to a predetermined thickness. In this way, the SOI substrate is prepared. The SOI substrate is a wafer and has a size that allows multiple sensor portions 10 to be formed to the SOI substrate.

Figure 2B:
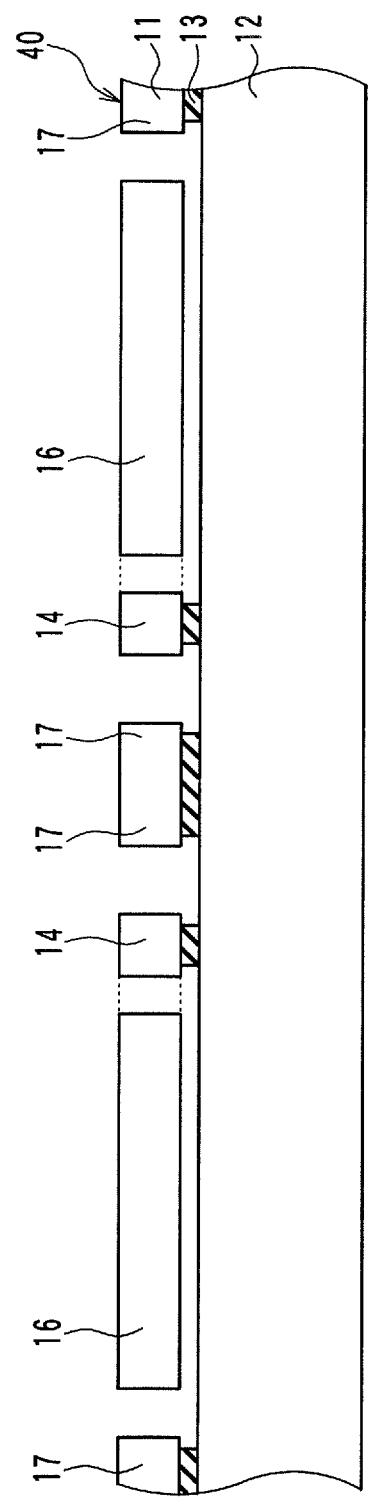

Next, in a process shown in FIG. 2B, multiple sensor portions 10 are formed to the SOI substrate. Specifically, the first silicon layer 11 is patterned by photolithography and dry etching to form the anchor portion 14, the beam portion 15, the oscillator 16, and the peripheral portion 17. Further, at this stage, the etching hole 16a is formed in the oscillator 16.

Then, the insulation layer 13 located under the beam portion 15 and the oscillator 16 of the first silicon layer 11 is removed by etching using an etchant such as hydrofluoric acid or hydrogen fluoride gas. In this case, the insulation layer 13 under the oscillator 16 can be removed by injecting the etchant into the etching hole 16a. Thus, the bean portion 15 and the oscillator 16 are suspended above the second silicon layer 12. In this way, the sensor portions 10 are formed to the SOI substrate. The SOI substrate where the sensor portions 10 are formed is hereinafter defined as a sensor wafer 40.

Figure 3A:
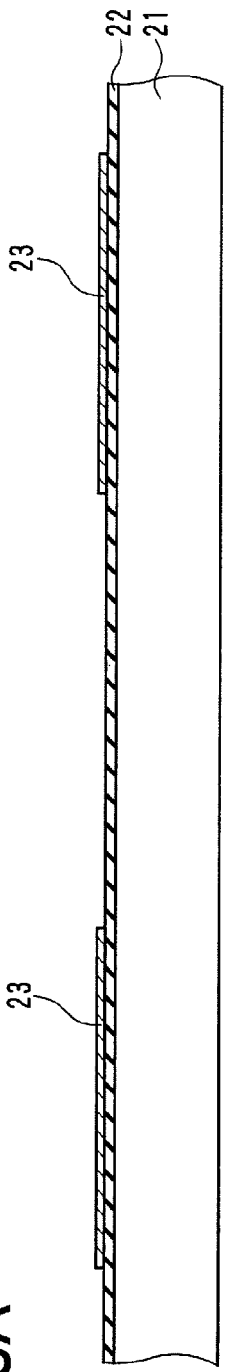
FIGS. 3A-3C are diagrams illustrating processes following the processes of FIGS. 2A and 2B.

Next, in a process shown in FIG. 3A, for example, a N-type monocrystalline silicon substrate 21 is prepared. The silicon substrate 21 is a wafer and has a size that allows multiple cap portions 20 to be formed to the silicon substrate 21. Then, a $SiO_2$ layer as the first insulation layer 22 is formed on the surface of the silicon substrate 21 by chemical-vapor deposition (CVD) or the like. Further, the wiring layer 23 is formed on the first insulation layer 22 and patterned so that the wiring layer 23 can be located in a position corresponding to the oscillator 16 of the sensor portion 10.

Figure 3B:
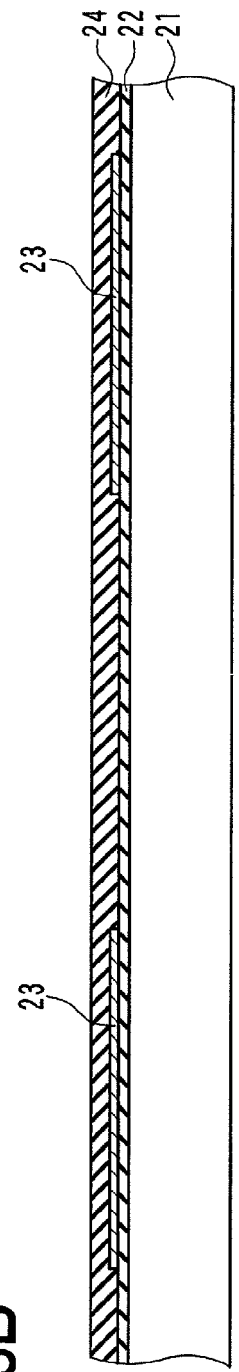

Then, in a process shown in FIG. 3B, a $SiO_2$ layer as the second insulation layer 24 is formed on the first insulation layer 22 and the wiring layer 23 by chemical-vapor deposition (CVD) or the like.

Figure 3C:
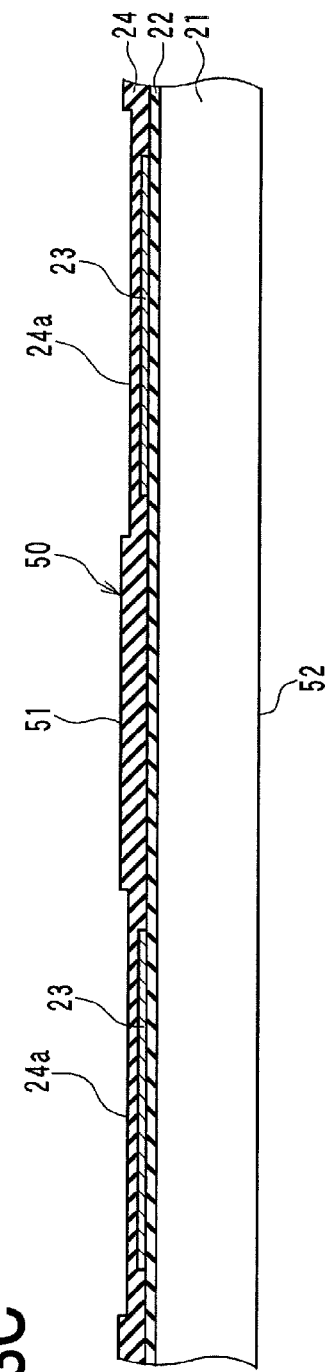

Next, in a process shown in FIG. 3C, the recessed portion 24a is formed in the second insulation layer 24 by etching a part of the second insulation layer 24 facing the oscillator 16.

The silicon substrate 21 obtained after the process shown in FIG. 3C is finished is hereinafter defined as a cap wafer 50. That is, the cap wafer 50 has multiple cap portions 20 in a position corresponding to multiple sensor portions 10 of the sensor wafer 40. The cap wafer 50 has a front side 51 and a back side 52 opposite to the front side 51. The front side 51 of the cap wafer 50 is joined to the sensor wafer 40 in a post-process.

Figure 4A:
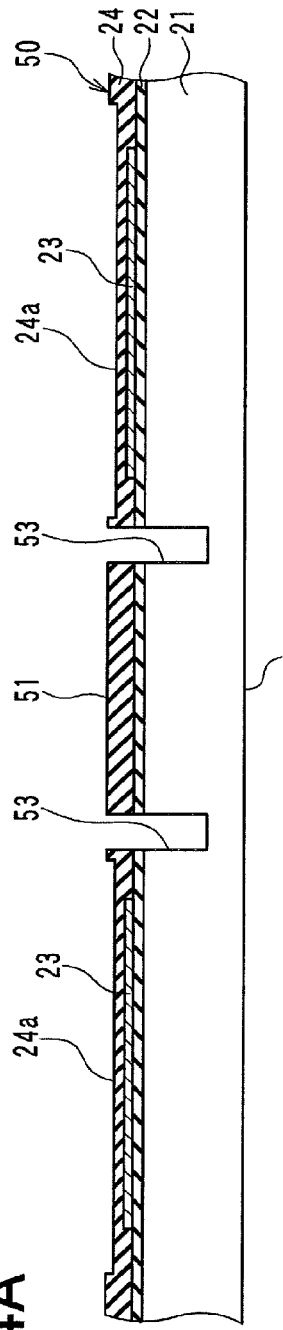
FIGS. 4A-4C are diagrams illustrating processes following the processes of FIGS. 3A-3C.

Then, in a process shown in FIG. 4A, a trench 53 is formed in the cap portion 20 on the front side 51 of the cap wafer 50 in a position corresponding to the contact region 14a. For example, the trench 53 can be formed by perpendicularly dry etching the second insulation layer 24 and the first insulation layer 22 and then by perpendicularly dry etching the silicon substrate 21. The trench 53 is formed into the through hole 25a in a post-process.

Figure 4B:
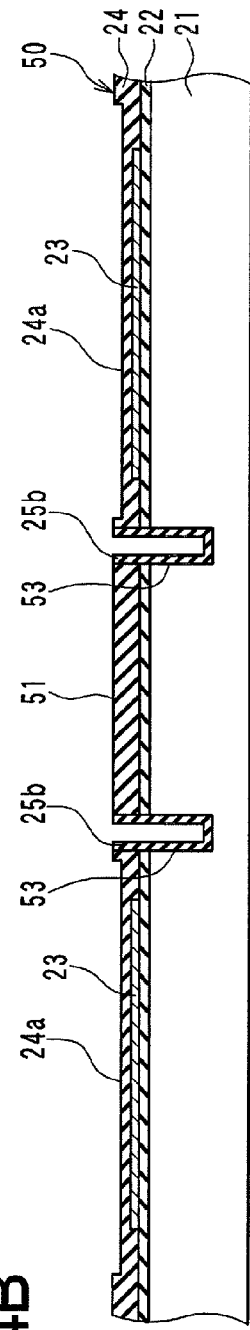

Next, in a process shown in FIG. 4B, a $SiO_2$ layer as the insulation layer 25b is formed on the wall of the trench 53 by chemical-vapor deposition (CVD) or the like.

Figure 4C:
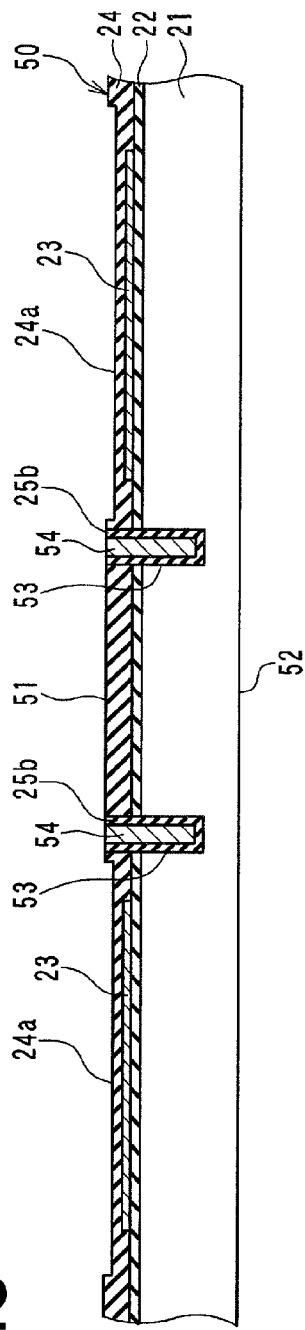

Then, in a process shown in FIG. 4C, a metal layer is formed on the front side 51 of the cap wafer 50 so that a buried electrode 54 can be formed on the insulation layer 25b. Then, the metal layer on the second insulation layer 24 is removed by etching.

Next, in a process shown in FIG. 5A, the sensor wafer 40 and the cap wafer 50 are directly joined together to form a joined body of the sensor wafer 40 and the cap wafer 50. Then, a sintering treatment is applied to the joined body so that the buried electrode 54 of the cap wafer 50 can be electrically connected to the contact region 14a of the sensor wafer 40.

Further, the sensor structure is sealed between the sensor portion 10 of the sensor wafer 40 and the cap portion 20 of the cap wafer 50. Thus, the sealed space 30 is formed between the sensor portion 10 and the cap portion 20.

Then, in a process shown in FIG. 5B, the back side 52 of the cap wafer 50 is removed. Specifically, firstly ions such as rare gas ions and hydrogen gas ions are implanted into the entire back side 52 of the cap wafer 50. In the first embodiment, hydrogen gas ions are implanted into the entire back side 52 of the cap wafer 50 at high energy of about 150 keV. Thus, an ion-implanted layer 55 having several hundreds of nanometers (nm) is formed in the cap wafer 50 at a depth equal to a bottom of the trench 53. In the ion-implanted layer 55, a hydrogen ion is arranged in a gap between silicon atoms.

Figure 6:
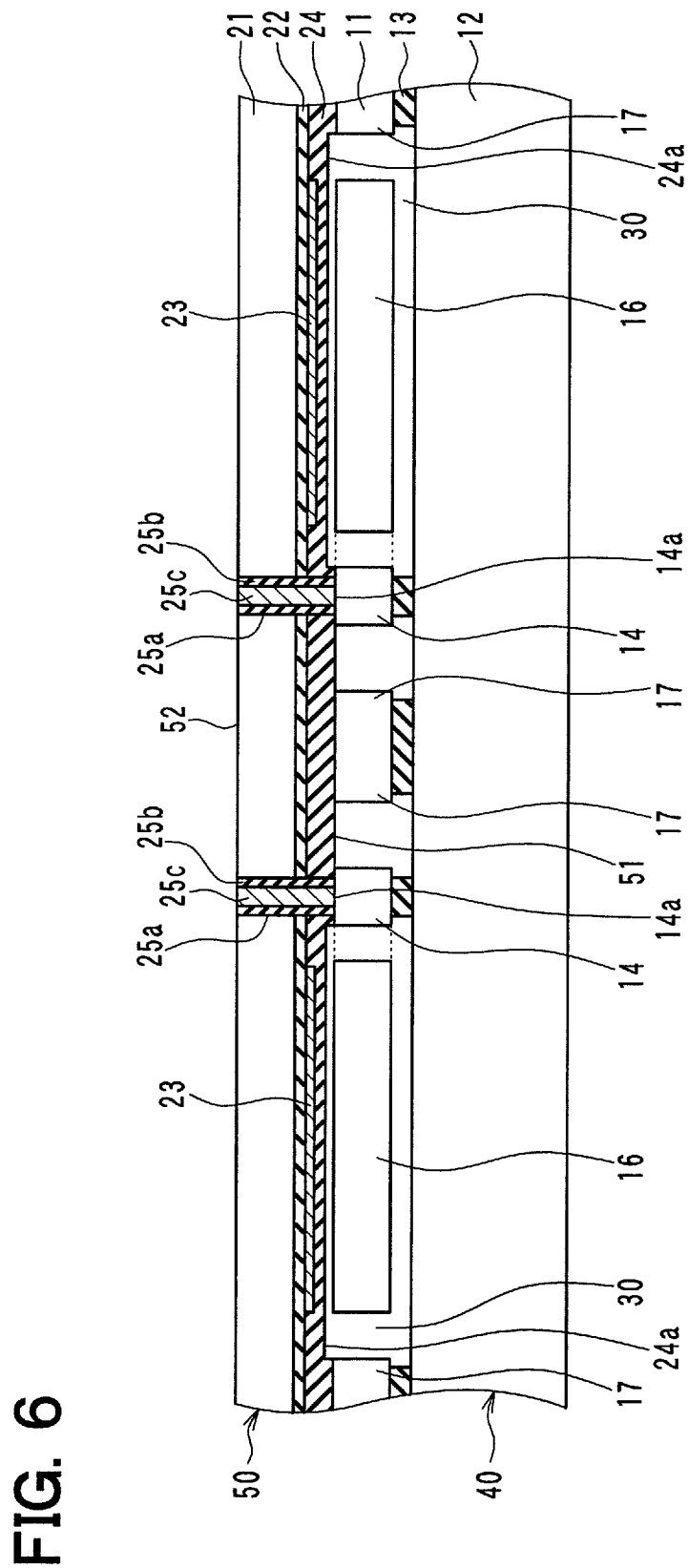
FIG. 6 is a diagram illustrating a process following the processes of FIGS. 5A and 5B.

Next, in a process shown in FIG. 6, the joined body of the sensor wafer 40 and the cap wafer 50 is thermally treated, for example, in nitrogen ($N_2$) atmosphere at a temperature of several hundreds of degrees Celsius (° C.). As a result, silicon-to-silicon bonding is released, and silicon is bonded to hydrogen. Since the bonding between silicon on the front side 51 of the cap wafer 50 and silicon on the back side 52 of the cap wafer 50 is released, the back side 52 is separated from the cap wafer 50 with respect to the ion-implanted layer 55 as a cleavage surface.

It is noted that hydrogen ions left on the cleavage surface remain in the cap wafer 50, are dispersed in the air, or replaced with oxygen in the air. Therefore, even when hydrogen ions remain in the cap wafer 50, the cap wafer 50 is not affected by the remaining hydrogen ions.

As described above, the ion-implanted layer 55 is formed in the cap wafer 50 at the depth equal to the bottom of the trench 53. Therefore, when the back side 52 of the cap wafer 50 is removed with respect to the ion-implanted layer 55, the insulation layer 25b formed on the bottom of the trench 53 is removed together with the back side 52 of the cap wafer 50. As a result, as shown in FIG. 6, the buried electrode 54 is exposed through a new surface of the back side 52 of the cap wafer 50. In this way, the trench 53 is formed into the through hole 25a, and the buried electrode 54 is formed into the through electrode 25c that penetrates the cap wafer 50.

Then, the joined body of the sensor wafer 40 and the cap wafer 50 is divided by dicing into multiple semiconductor devices in the form of chips, each of which includes the sensor portion 10 and the cap portion 20. Thus, the semiconductor device shown in FIG. 1 is made.

Although not shown in the drawings, the through electrode connected to the wiring layer 23 of the cap portion 20 can be formed in the same process as the buried electrode 54.

Below, how the semiconductor device detects a physical quantity such as an acceleration or an angular rate is discussed. When an acceleration or an angular rate is applied to the semiconductor device, the beam portion 15 of the oscillator 16 is deformed (e.g., bent) so that the oscillator 16 vibrates in the direction perpendicular to the surface 10a of the sensor portion 10 with respect to the wiring layer 23 that is fixed. Accordingly, a distance between the wiring layer 23 and the oscillator 16 changes. A capacitance of the capacitor formed with the wiring layer 23 and the oscillator 16 changes with the change in the distance between the wiring layer 23 and the oscillator 16. The acceleration or angular rate applied to the semiconductor device can be detected by detecting the capacitance change.

As described above, according to the first embodiment, the buried electrode 54 is formed to the cap wafer 50 in advance. Then, after the sensor wafer 40 and the cap wafer 50 are joined together, the ion-implanted layer 55 is formed in the cap wafer 50. Then, the back side 52 of the cap wafer 50 is removed with respect to the ion-implanted layer 55.

Therefore, through holes are not formed in the cap wafer 50, before the sensor wafer 40 and the cap wafer 50 are joined together. Accordingly, the surface area of the cap wafer 50 is not reduced so that the thickness, i.e., the strength of the cap wafer 50 can be maintained. Therefore, handling such as sucking, holding, and carrying the cap wafer 50 can be improved.

Further, according to the first embodiment, an unnecessary part of the back side 52 of the cap wafer 50 is removed (e.g. peeled off) by forming the ion-implanted layer 55 in the cap wafer 50. In such an approach, the through electrode 25c can be easily formed. Further, the removed unnecessary part can be recycled as a silicon substrate.

Furthermore, according to the first embodiment, the potential of the sensor structure is transmitted to the second surface 20b of the cap portion 20 through the through electrode 25c. Specifically, the contact region 14a of the sensor portion 10 is not exposed through the cap portion 20, and the potential of the anchor portion 14 is transmitted to the second surface 20b of the cap portion 20 through the through electrode 25c. Therefore, there is no need to form a through hole in the cap portion 20 to connect a wire to the contact region 14a. Thus, the semiconductor device can be reduced in size in a surface direction of the surface 10a of the sensor portion 10 while maintaining enough thickness of the cap portion 20 to improve the strength of semiconductor device. Accordingly, the total size of the semiconductor device is reduced.

In contrast, according to a conventional structure in which the contact region 14a is exposed through a through hole formed in the cap portion 20, there is a need to increase the size of the through hole as the thickness of the cap portion 20 is larger. As a result, the total size of the semiconductor device is increased.

Furthermore, according to the first embodiment, after the ion-implanted layer 55 is thermally treated, the back side 52 of the cap wafer 50 is removed with respect to the ion-implanted layer 55 as a cleavage surface. In such an approach, the new surface of the back side 52 of the cap wafer 50 can become a smooth surface. Therefore, a process for smoothing the new surface of the back side 52 can be omitted so that the manufacturing process can be simplified.

It is note that the sensor structure according to the first embodiment is formed with the anchor portion 14, the beam portion 15, and the oscillator 16 as described previously.

(Second Embodiment)

A second embodiment of the present invention is discussed below. A difference between the first embodiment and the second embodiment is as follows. According to the second embodiment, after the process shown in FIG. 5A is finished, the back side 52 of the cap wafer 50 is mechanically polished until the buried electrode 54 is exposed. The term "mechanically polished" includes cutting, deforming, and wearing the back side 52 of the cap wafer 50 in order to smooth the back side 52, for example like a mirror. In such an approach, the buried electrode 54 can be exposed through the new surface of the back side 52 and formed into the through electrode 25c.

(Third Embodiment)

A third embodiment of the present invention is discussed below. A difference between the preceding embodiments and the third embodiment is as follows. In the third embodiment, after the process shown in FIG. 5A is finished, the back side 52 of the cap wafer 50 is polished by chemical mechanical polishing (CMP). The CMP is a process for planarizing the back side 52 by mechanically polishing the back side 52 using a chemical polish agent. In such an approach, the buried electrode 54 can be exposed through the new surface of the back side 52 and formed into the through electrode 25c. The CMP process can polish the new surface of the back side 52 to a mirror finish.

Materials of the cap wafer 50, the insulation layer 25b, and the through electrode 25c have different hardness. Therefore, a position of a tip (i.e., exposed surface) of the through electrode 25c with respect to the back side 52 of the cap wafer 50 can be adjusted by adjusting chemical-mechanical polishing (CMP) rates of the cap wafer 50, the insulation layer 25b, and the through electrode 25c.

For example, like the first embodiment, the through electrode 25c can be exposed though the back side 52 of the cap wafer 50 in such a manner that the tip of the through electrode 25c can be at the same level as the back side 52. Alternatively, the tip of the through electrode 25c can project or is recessed with respect to the back side 52.

(Fourth Embodiment)

A fourth embodiment of the present invention is discussed below. A difference between the preceding embodiments and the fourth embodiment is as follows. In the fourth embodiment, after the process shown in FIG. 5A is finished, an etching process is performed to etch the back side 52 of the cap wafer 50. For example, the back side 52 of the cap wafer 50 can be etched by dry etching such as plasma etching. In such an approach, the buried electrode 54 can be exposed through the new surface of the back side 52 and formed into the through electrode 25c.

(Fifth Embodiment)

Figure 7:
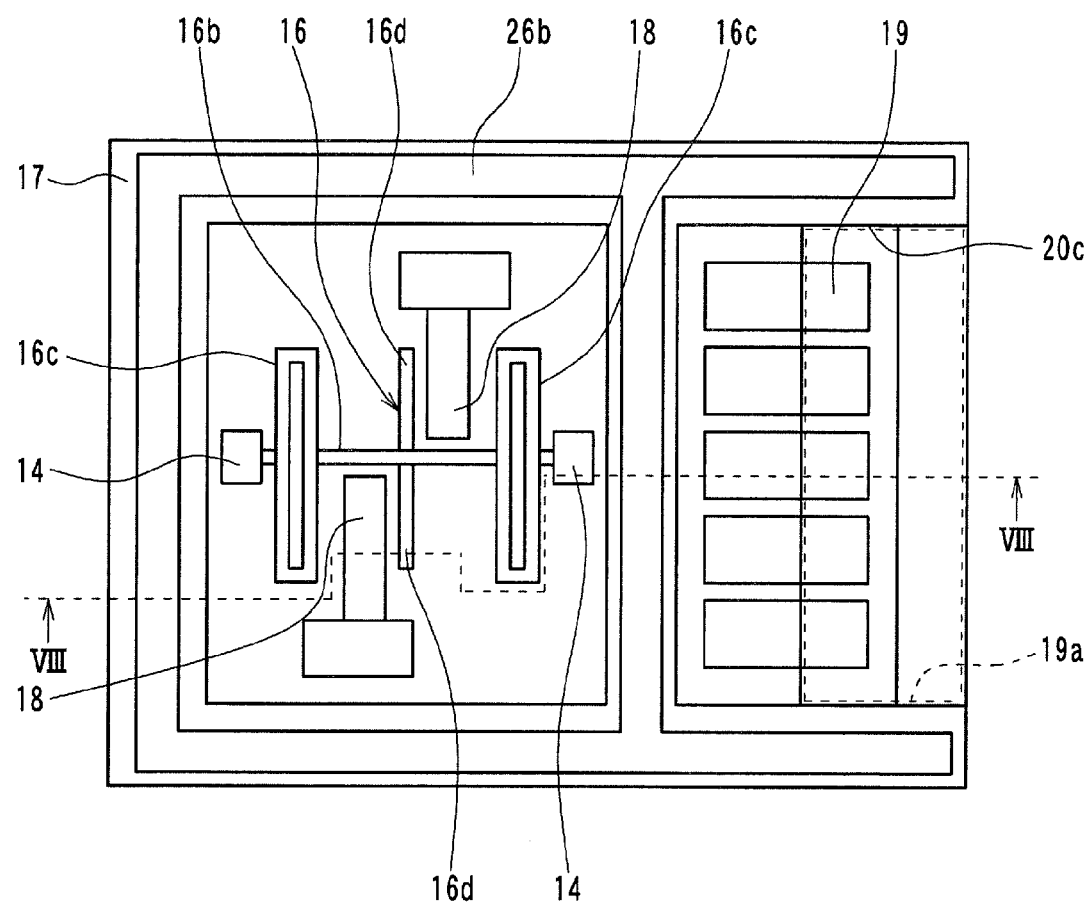
FIG. 7 is a diagram illustrating a plan view of a semiconductor device according to a fifth embodiment of the present invention.
Figure 8:
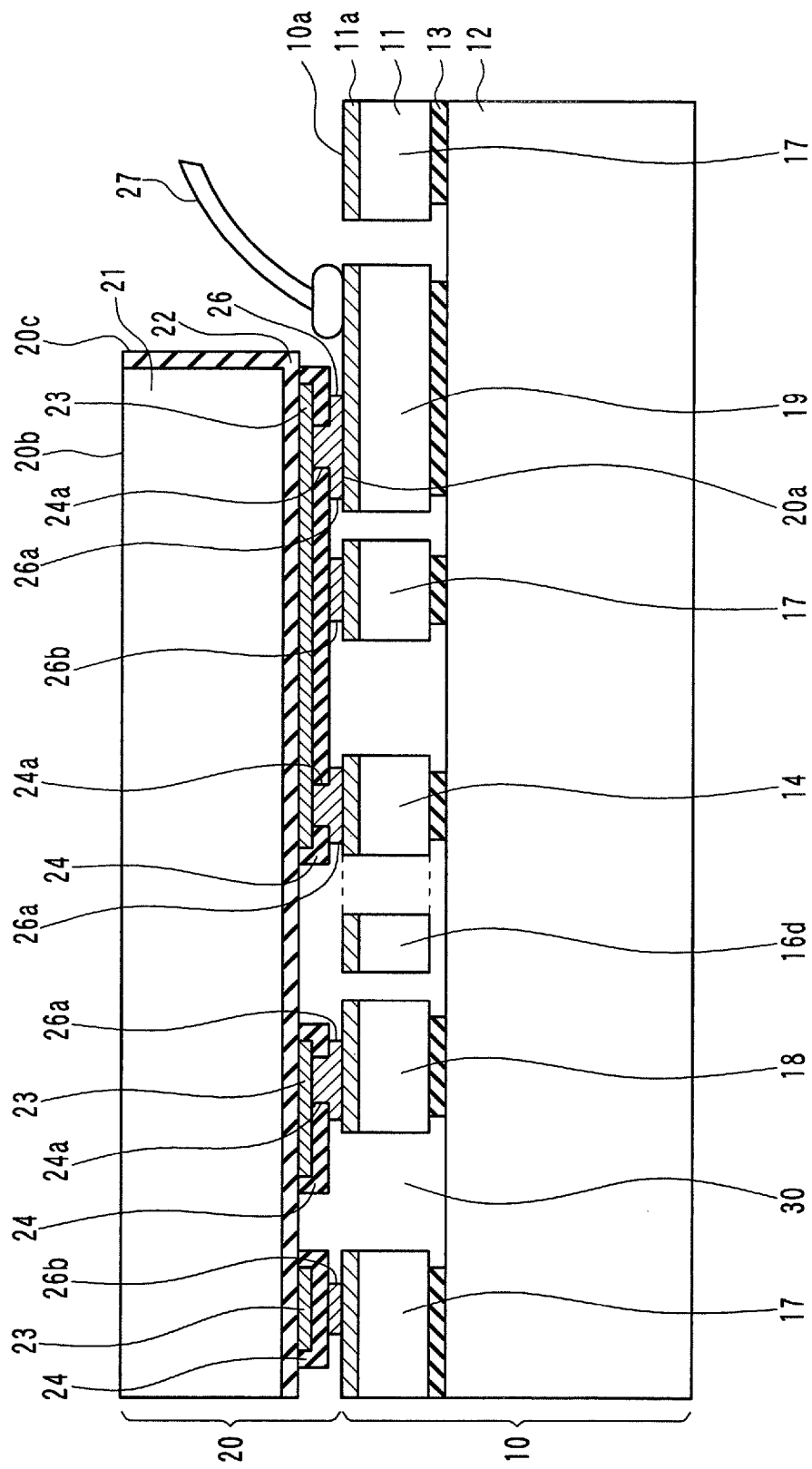
FIG. 8 is a diagram illustrating a cross-sectional view taken along the line VIII-VIII in FIG. 7.

A semiconductor device according to a fifth embodiment of the present invention is discussed below with reference to FIGS. 7 and 8. FIG. 7 is a plan view of the semiconductor device, and FIG. 8 is a cross-sectional view taken along the line VIII-VIII in FIG. 7. A difference between the preceding embodiments and the fifth embodiment is summarized as follows. In the preceding embodiments, the sensor structure is electrically connected to external circuitry through the through electrode 25c of the cap portion 20. In contrast, according to the fifth embodiment, a wire bonding is directly applied to the sensor portion 10.

As shown in FIG. 8, like the preceding embodiments, a sensor portion 10 and a cap portion 20 are stacked together.

The sensor portion 10 is formed with a silicon-on-insulator (SOI) substrate in which an insulation layer 13 is sandwiched between a first silicon layer 11 and a second silicon layer 12. According to the fifth embodiment, a wiring layer 11a such as an aluminum (Al) layer is formed on a surface of the first silicon layer 11. Therefore, the surface of the wiring layer 11a is a surface 10a of the sensor portion 10.

A sensing portion including an anchor portion 14, an oscillator 16, a peripheral portion 17, a fixed electrode portion 18, and a connection portion 19 is formed in the first silicon layer 11.

The anchor portion 14 is shaped like a block and supports the oscillator 16 with respect to the second silicon layer 12. Two anchor portions 14 are located on the insulation layer 13, and the oscillator 16 is located between the anchor portions 14.

The oscillator 16 includes a straight portion 16b, a beam portion 16c, and a movable electrode 16d. The straight portion 16b joins the anchor portions 14 together. The beam portion 16c is joined to the straight portion 16b. The movable electrode 16d is shaped like a rod and extends perpendicularly from the straight portion 16b. The oscillator 16 is located between the anchor portions 14 so that the oscillator 16 can be suspended above the second silicon layer 12.

The fixed electrode portion 18 faces the movable electrode 16d of the oscillator 16. The fixed electrode portion 18 is fixed on the insulation layer 13. The movable electrode 16d of the oscillator 16 is interleaved with the fixed electrode portion 18 to form a comb electrode, i.e., a capacitor. Although FIG. 7 depicts that the comb electrode is formed with one movable electrode 16d and one fixed electrode portion 18, the comb electrode can be formed with multiple movable electrodes 16d and multiple fixed electrode portions 18.

A comb structure formed with the anchor portion 14, the oscillator 16, and the fixed electrode portion 18 is hereinafter defined as a sensor structure.

The connection portion 19 serves as a terminal for electrically connecting the semiconductor device to external circuitry. As shown in FIG. 8, the connection portion 19 is located on an outer region of the surface 10a of the sensor portion 10. As mentioned previously, the wiring layer 11a is formed on the first silicon layer 11. Therefore, the semiconductor device can be electrically connected to external circuitry through the wiring layer 11a and the connection portion 19.

The peripheral portion 17 surrounds the entire periphery of the sensor structure and the entire periphery of the connection portion 19. The peripheral portion 17 is joined to the cap portion 20 so that the sensor structure can be sealed. Alternatively, the connection portion 19 can be partially surrounded by the peripheral portion 17.

The cap portion 20 includes a silicon substrate 21, a first insulation layer 22, a first wiring layer 23, a second insulation layer 24, and a second wiring layer 26.

The silicon substrate 21 has a rectangular side surface. As shown in FIG. 7, the rectangular side surface of the silicon substrate 21 is recessed to form a recessed portion 20c. When the sensor portion 10 and the cap portion 20 are joined together, the connection portion 19 is exposed outside the silicon substrate 21 through the recessed portion 20c. A region where the connection portion 19 exposed outside the cap portion 20 is located is hereinafter defined as a connection region 19a.

The silicon substrate 21 has a facing surface that faces the sensor portion 10. The first insulation layer 22 is formed on the facing surface of the silicon substrate 21. Further, the first insulation layer 22 is formed on the rectangular side surface of the silicon substrate 21. For example, the first insulation layer 22 can be made of an insulating material such as silicon dioxide ($SiO_2$) or silicon nitride ($Si_3N_4$).

The first wiring layer 23 is formed on the first insulation layer 22 by patterning. The first wiring layer 23 is patterned to connect the anchor portion 14 and the connection portion 19 and to connect the fixed electrode portion 18 and the connection portion 19. Further, the first wiring layer 23 is patterned to be located in a position corresponding to the peripheral portion 17.

The second insulation layer 24 covers the first wiring layer 23. The second insulation layer 24 has openings 24a that face the fixed electrode portion 18, the anchor portion 14, and the connection portion 19, respectively.

The second wiring layer 26 is formed on the second insulation layer 24 by patterning. The second wiring layer 26 includes a wiring portion 26a and a hermetical sealing portion 26b. The wiring portion 26a is connected to each of the anchor portion 14, the fixed electrode portion 18, and the connection portion 19 of the sensor portion 10. The sealing portion 26b is joined to the peripheral portion 17 of the sensor portion 10. As shown in FIG. 7, the sealing portion 26b surrounds the entire periphery of the sensor structure. Further, the sealing portion 26b crosses over the first wiring layer 23. Since the first wiring layer 23 and the second wiring layer 26 are located at different levels, the sealing portion 26b of the second wiring layer 26 can cross over the first wiring layer 23.

In the second wiring layer 26, a height of the wiring portion 26a from the facing surface of the silicon substrate 21 is equal to a height of the sealing portion 26b from the facing surface of the silicon substrate 21. Therefore, a surface of the second wiring layer 26 is a first surface 20a of the cap portion 20, and a surface opposite to the facing surface of the silicon substrate 21 is a second surface 20b of the cap portion 20. The second surface 20b of the cap portion 20 is a cleavage surface.

As mentioned above, according to the fifth embodiment, the side surface of the silicon substrate 21 has the recessed portion 20c. Therefore, the second wiring layer 26 corresponding to the peripheral portion 17 facing the recessed portion 20c is not formed. The second wiring layer 26 surrounds the entire periphery of the sensor structure of the sensor portion 10.

The sealing portion 26b of the cap portion 20 is, for example, directly joined to the peripheral portion 17 of the sensor portion 10. Thus, as shown in FIG. 8, the sensor structure is sealed in a sealed space 30 that is formed by the second silicon layer 12, the insulation layer 13, the peripheral portion 17, the sealing portion 26b, the second insulation layer 24, and the first insulation layer 22.

The first surface 20a of the cap portion 20 is joined to the surface 10a of the sensor portion 10. Thus, the anchor portion 14 is connected to the connection portion 19 through the wiring portion 26a and the first wiring layer 23 that are located inside the sealed space 30 and the wiring portion 26a that is located outside the sealed space 30. Likewise, the fixed electrode portion 18 is connected to the connection portion 19 through the wiring portion 26a and the first wiring layer 23 that are located inside the sealed space 30 and the wiring portion 26a that is located outside the sealed space 30.

Further, as shown in FIG. 7, the connection region 19a of the sensor portion 10 is exposed outside the cap portion 20 through the recessed portion 20c. That is, the connection portion 19 is exposed outside the cap portion 20. As shown in FIG. 8, a wire 27 is connected to the connection portion 19 exposed outside the cap portion 20. Thus, the semiconductor device can be electrically connected to external circuitry.

A method of making the semiconductor device shown in FIGS. 7 and 8 is discussed below with reference to FIGS. 9-13. Each of FIGS. 9-13 corresponds to a cross-sectional view taken along the line VIII-VIII in FIG. 7, Although multiple sensor portions 10 and multiple cap portions 20 are formed in a wafer, FIGS. 9-13 depict two of the multiple sensor portions 10 and two of the multiple cap portions 20.

Figure 9:
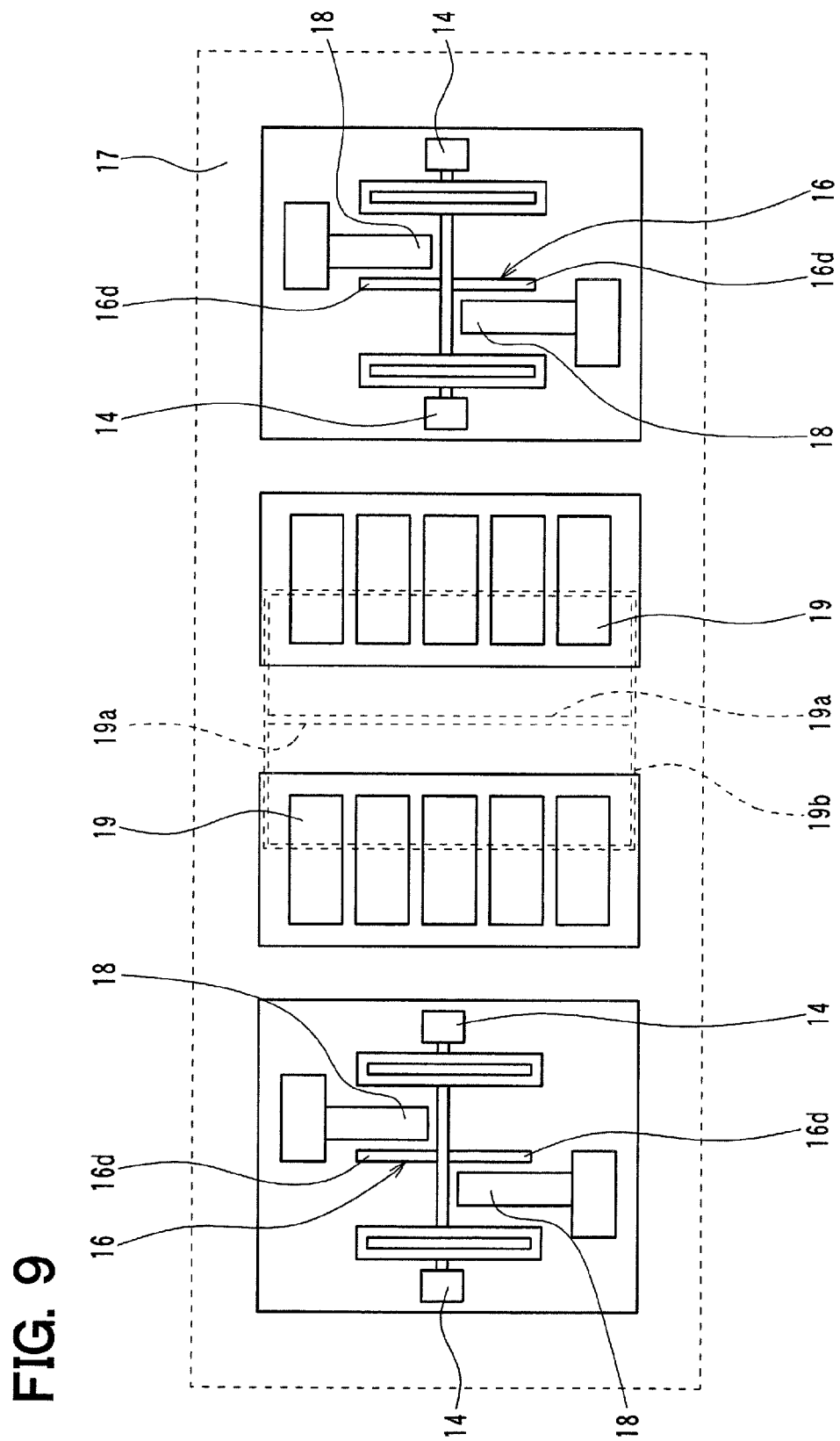
FIG. 9 is a diagram illustrating a process of a method of making the semiconductor device according to the second embodiment.

Firstly, in the process shown in FIG. 2A, the SOI substrate having a size that allows multiple sensor portions 10 to be formed to the SOI substrate is prepared. Then, the first silicon layer 11 and the wiring layer 11a of the SOI substrate are patterned to form multiple sensor portions 10. In this case, as shown in FIG. 9, the multiple sensor portions 10 are formed in such a manner that the connection region 19a of one sensor portion 10 faces the connection region 19a of the other sensor portion 10. The entire region of the two connection regions 19a facing each other is hereinafter defined as a cavity region 19b. Accordingly, the cavity region 19b is located between the sensor structure of one sensor portion 10 and the sensor structure of the other sensor portion 10. The SOI substrate where multiple sensor portions 10 are formed is hereinafter defined as a sensor wafer 40.

Next, the cap portion 20 is formed. Specifically, in a process shown in FIG. 10A, for example, a N-type monocrystalline silicon substrate 21 is prepared. The silicon substrate 21 is a wafer and has a size that allows multiple cap portions 20 to be formed to the silicon substrate 21. This wafer is hereinafter defined as a cap wafer 50. The cap wafer 50 has a front side 51 and a back side 52 opposite to the front side 51. The front side 51 of the cap wafer 50 is joined to the sensor wafer 40 in a post-process.

Further, by photolithography and etching, a recessed portion 56 is formed to the front side 51 of the cap wafer 50 in a position facing the cavity region 19b of the sensor wafer 40. Then, the first insulation layer 22 made of an insulating material such as $SiO_2$ or $Si_3N_4$ is formed on the front side 51 of the cap wafer 50 by low-pressure CVD, plasma CVD, or the like.

Figure 10A:
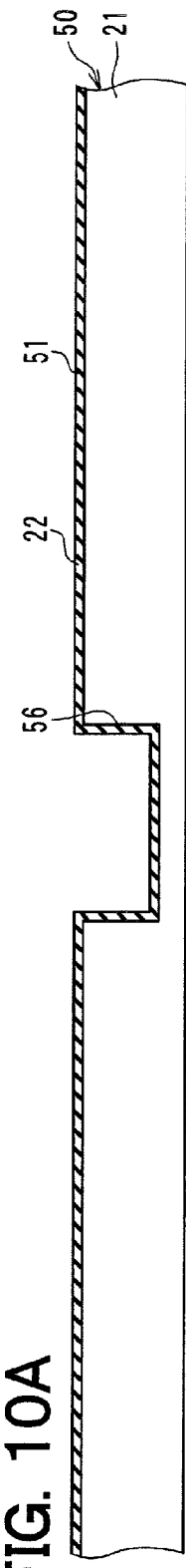
FIGS. 10A-10D are diagrams illustrating processes following the process of FIG. 9.
Figure 10B:
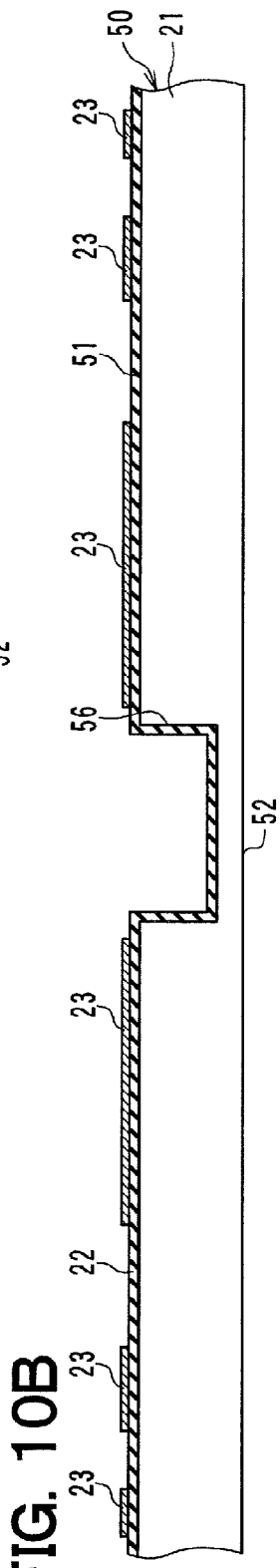

Next, in a process shown in FIG. 10B, an aluminum (Al) layer is formed on the first insulation layer 22 by CVD, or the like. The Al layer is patterned to connect the anchor portion 14 and the connection portion 19 and to connect the fixed electrode portion 18 and the connection portion 19. Further, the Al layer is patterned to be located in a position corresponding to the peripheral portion 17. In this way, the first wiring layer 23 is formed on the first insulation layer 22.

Figure 10C:
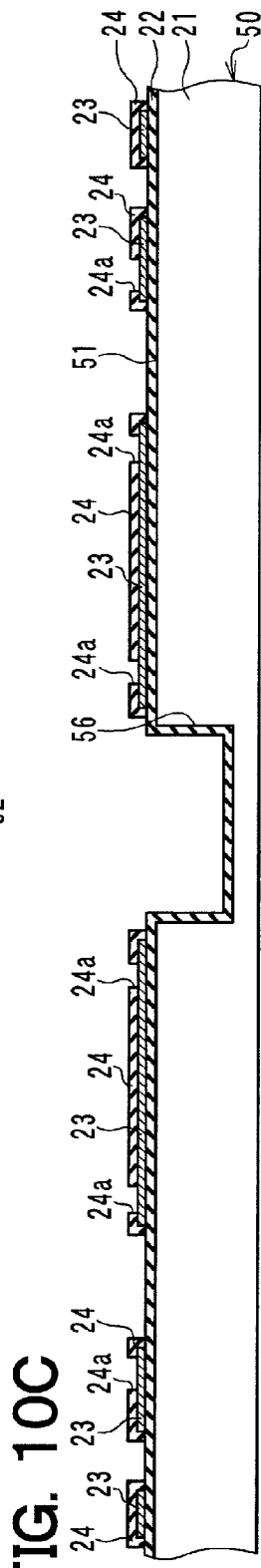

Then, in a process shown in FIG. 10C, a $SiO_2$ layer as the second insulation layer 24 is formed on the first wiring layer 23 and the first insulation layer 22. The second insulation layer 24 is patterned to form the openings 24a that face the anchor portion 14, the fixed electrode portion 18, and the connection portion 19, respectively. The first wiring layer 23 is exposed though the openings 24a. The openings 24a allow the first wiring layer 23 to be electrically connected to the second wiring layer 26 that is formed in a post-process. Further, at this stage, a part of the second insulation layer 24 located in a position corresponding to a movable electrode 16d of the oscillator 16 is removed so that the movable electrode 16d can be less likely to be in contact with the cap portion 20.

Figure 10D:
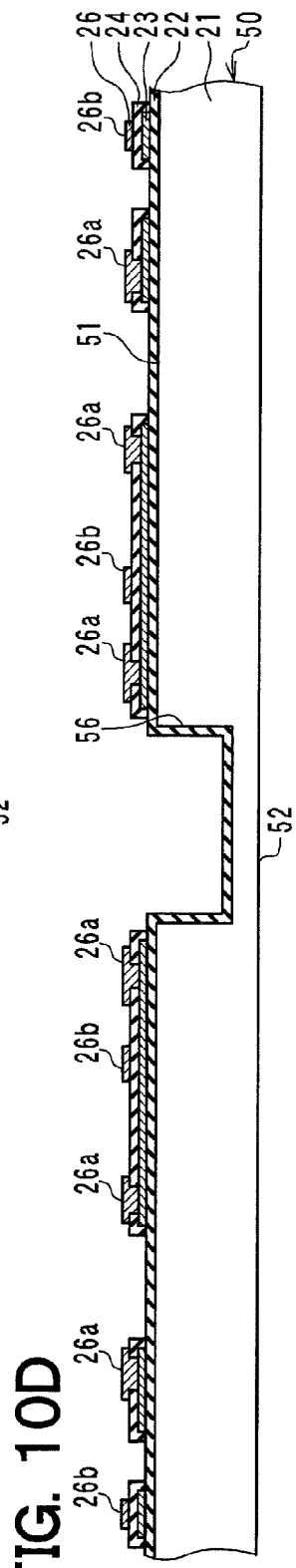

Next, in a process shown in FIG. 10D, an aluminum (Al) layer as the second wiring layer 26 is formed on the second insulation layer 24. The second wiring layer 26 is formed into the wiring portion 26a and the sealing portion 26b, for example, by patterning or using a mask. Thus, the wiring portion 26a of the second wiring layer 26 can be electrically connected to the first wiring layer 23 through the openings 24a of the second insulation layer 24. The sealing portion 26b is patterned so that the sealing portion 26b can surround the entire periphery of the sensor structure of the sensor portion 10.

It is noted that the wiring portion 26a and the sealing portion 26b are formed in such a manner that the height of the wiring portion 26a from the front side 51 of the cap wafer 50 can be equal to the height of the sealing portion 26b from the front side 51. The sealing portion 26b can be electrically floated. Alternatively, the sealing portion 26b can be at a predetermined potential (e.g., a ground potential) as needed.

Then, in a process shown in FIG. 11A, the surface 10a of the sensor wafer 40 is placed to face the front side 51 of the cap wafer 50, and then the sensor wafer 40 and the cap wafer 50 are directly joined together to form a joined body of the sensor wafer 40 and the cap wafer 50.

Specifically, the peripheral portion 17 of the sensor wafer 40 is joined to the sealing portion 26b of the cap wafer 50 so that the sensor structure can be hermetically sealed in the sealed space 30. Further, the fixed electrode portion 18, the anchor portion 14, and the connection portion 19 of the sensor wafer 40 are joined to the wiring portion 26a of the cap wafer 50. Thus, the sensor structure of the sensor portion 10 is electrically connected to the connection portion 19.

In this way, the sensor wafer 40 is covered with the cap wafer 50. Accordingly, the cavity region 19b of the sensor wafer 40 is covered with the recessed portion 56. Specifically, the cavity region 19b is covered with the first insulation layer 22 formed on a wall of the recessed portion 56. More specifically, the cavity region 19b is covered with the first insulation layer 22 formed on the bottom of the recessed portion 56.

Next, in a process shown in FIG. 11B, like in the process shown in FIG. 5B, hydrogen gas ions are implanted into the entire back side 52 of the cap wafer 50. Thus, an ion-implanted layer 55 is formed in the cap wafer 50 at a depth equal to the bottom of the recessed portion 56.

Figure 12:
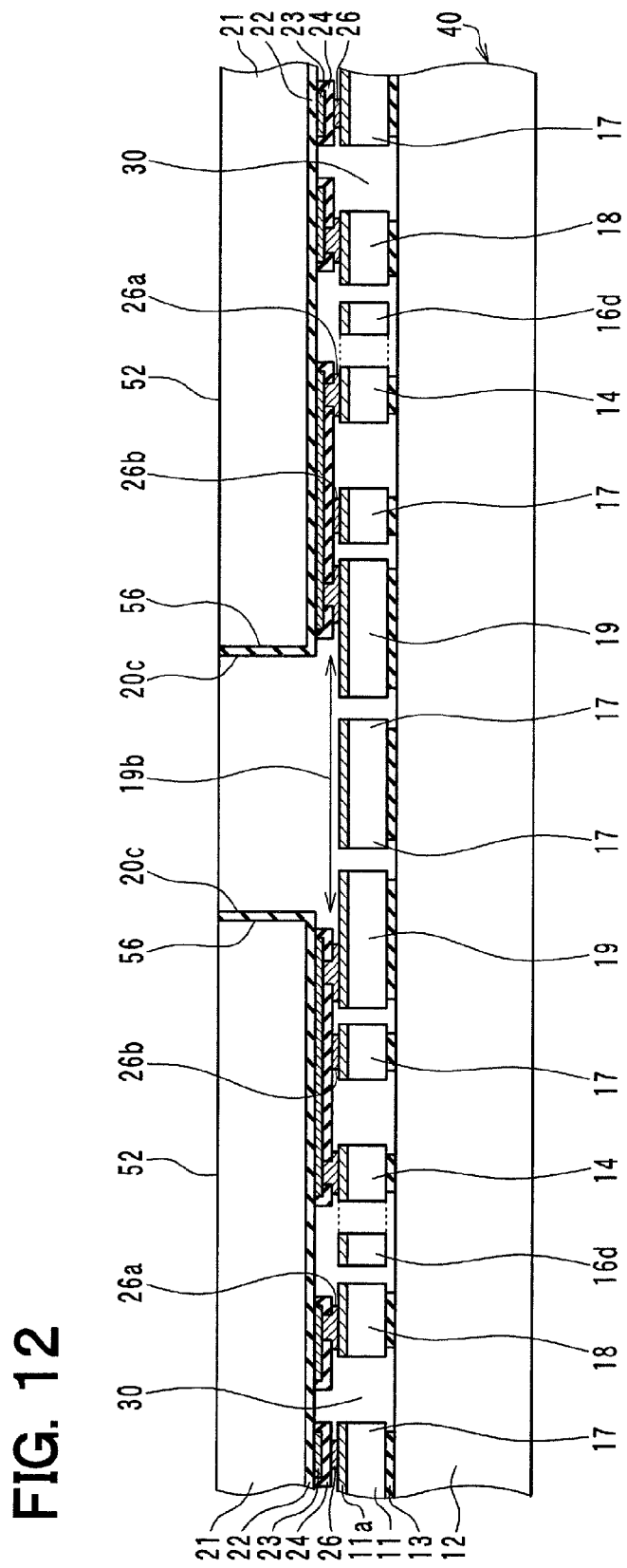
FIG. 12 is a diagram illustrating a process following the processes of FIGS. 11A and 11B.

Next, in a process shown in FIG. 12, the joined body of the sensor wafer 40 and the cap wafer 50 is thermally treated so that the back side 52 of the cap wafer 50 is separated from the front side 51 of the cap wafer 50 with respect to the ion-implanted layer 55 as a cleavage surface. Thus, the bottom of the recessed portion 56 is removed so that the cavity region 19b can be exposed through a new surface of the back side 52 of the cap wafer 50. The new surface of the back side 52 of the cap wafer 50 is a cleavage surface. Accordingly, the second surface 20b of the cap portion 20 can be smooth rather than rough.

Figure 13:
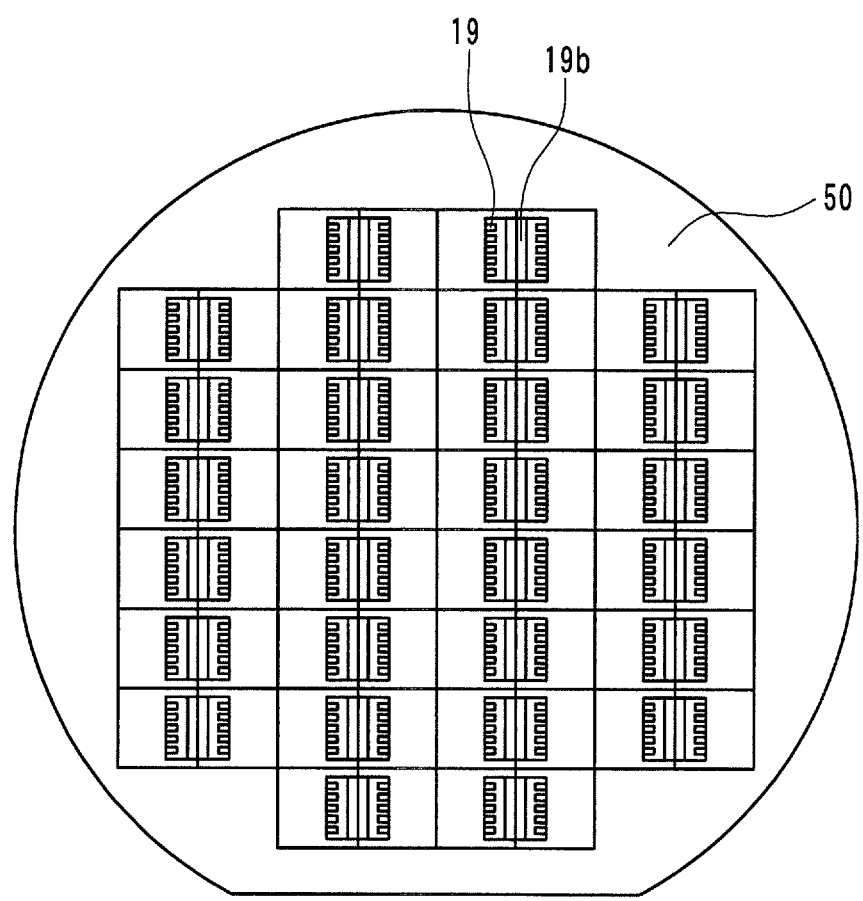
FIG. 13 is a diagram illustrating a process following the process of FIG. 12.

Then, in a process shown in FIG. 13, the joined body of the sensor wafer 40 and the cap wafer 50 is divided by dicing into multiple semiconductor devices in the form of chips, each of which includes the sensor portion 10 and the cap portion 20. Thus, the connection region 19a of the sensor portion 10 is exposed outside the cap portion 20. In this way, the semiconductor device shown in FIGS. 7 and 8 is made. For example, the semiconductor device can be mounted on an electronic component or a circuit board and electrically connected to the electronic component or the circuit board through the wire 27 that is connected to the connection portion 19.

Below, how the semiconductor device detects a physical quantity such as an acceleration or an angular rate is discussed. When an acceleration or an angular rate is applied to the semiconductor device, the beam portion 16c of the oscillator 16 is deformed so that the movable electrode 16d of the oscillator 16 can be displaced in a longitudinal direction of the straight portion 16b with respect to the fixed electrode portion 18 that is fixed. Accordingly, a capacitance of the capacitor formed with the movable electrode 16d and the fixed electrode portion 18 changes. The acceleration or angular rate in a direction parallel to the surface 10a of the sensor portion 10 can be detected by detecting the capacitance change.

As described above, according to the fifth embodiment, the sensor wafer 40 and the cap wafer 50 are joined together, before the through hole for exposing the cavity region 19b is formed in the cap wafer 50. That is, before the sensor wafer 40 and the cap wafer 50 are joined together, the surface area of the cap wafer 50 is not reduced so that the thickness, i.e., the strength of the cap wafer 50 can be maintained. Therefore, handing of the cap wafer 50 is improved so that it can be easy to join the sensor wafer 40 and the cap wafer 50 together by handing the cap wafer 50.

Further, according to the fifth embodiment, since the connection portion 19 is exposed outside the cap portion 20 in the connection region 19a, the cap portion 20 has no through hole for exposing the connection portion 19. Therefore, there is no need that the planar size of the cap portion 20 is increased in order to form such a through hole in the cap portion 20. Thus, the semiconductor device can be reduced in size in a surface direction of the surface 10a of the sensor portion 10. Accordingly, the total size of the semiconductor device is reduced.

As noted previously, in the fifth embodiment, the comb structure formed with the anchor portion 14, the oscillator 16, and the fixed electrode portion 18 is defined as the sensor structure.

(Sixth Embodiment)

A sixth embodiment of the present invention is discussed below. A difference between the fifth embodiment and the sixth embodiment is as follows. In the sixth embodiment, after the process shown in FIG. 11A is finished, the back side 52 of the cap wafer 50 is etched in the same manner as in the fourth embodiment. In such an approach, the recessed portion 56 of the cap wafer 50 is penetrated (i.e., the bottom of the recessed portion 56 is removed) so that the cavity region 19b can be exposed through the new surface of the back side 52 of the cap wafer 50.

It is preferable that the etching be performed in two stages in order to protect the wiring layer 11a of the connection portion 19 from the etching. Specifically, in the first stage, the silicon is etched. In the second stage subsequent to the first stage, the first insulation layer 22 is etched.

If the etching amount of the back side 52 of the cap wafer 50 is insufficient, the first insulation layer 22 on the bottom of the recessed portion 56 may remain exposed to the back side 52. Even in such a case, there is no problem, because the remaining first insulation layer 22 is removed when the wafer is divided by dicing into individual chips.

(Seventh Embodiment)

A seventh embodiment of the present invention is discussed below. A difference between the fifth and sixth embodiments and the seventh embodiment is as follows. In the seventh embodiment, after the process shown in FIG. 11A is finished, a process shown in FIG. 14A is performed. In the process shown in FIG. 14A, a dicing tape 60 is placed on the back side 52 of the cap wafer 50.

Then, in a process shown in FIG. 14B, a portion of the back side 52 of the cap wafer 50 is cut through the dicing tape 60. The portion to be cut faces the cavity region 19b. That is, the portion to be cut corresponds to the bottom of the recessed portion 56.

In this case, although the cut portion is separated from the cap wafer 50, the cut portion remains stuck to the dicing tape 60.

Then, the dicing tape 60 is removed from the back side 52 of the cap wafer 50. Thus, the cut portion of the cap wafer 50 is removed from the cap wafer 50 along with the dicing tape 60. In such an approach, the recessed portion 56 of the cap wafer 50 is penetrated so that the cavity region 19b can be exposed through the new surface of the back side 52 of the cap wafer 50.

Then, the joined body of the sensor wafer 40 and the cap wafer 50 is divided into semiconductor devices in the form of chips. Thus, the connection region 19a of the sensor portion 10 is exposed outside the cap portion 20.

As described above, according to the seventh embodiment, the portion of the cap wafer 50 facing the cavity region 19b, i.e., the portion of the cap wafer 50 corresponding to the bottom of the recessed portion 56 is removed by using the dicing tape 60. In such an approach, the cavity region 19b can be exposed through the new surface of the back side 52 of the cap wafer 50.

It is noted that, according to the preceding embodiments, the entire back side 52 of the cap wafer 50 is removed uniformly. In contrast, according to the sixth embodiment, since the back side 52 of the cap wafer 50 is removed partially, the thickness of the cap wafer 50 is unchanged. Therefore, the cap portion 20 of the semiconductor device in the form of a chip can have enough thickness to improve the strength of the semiconductor device.

That is, the cavity region 19b can be exposed while maintaining the thickness of the cap portion 20. Therefore, the semiconductor device can be reduced in size in a surface direction of the surface 10a of the sensor portion 10 while maintaining the thickness of the cap portion 20.

(Modifications)

The embodiments described above can be modified in various ways, for example, as follows. In the first to fourth embodiments, the sensor portion 10 is configured to detect acceleration or angular rate in a direction perpendicular to the surface 10a of the sensor portion 10. In contrast, in the fifth to seventh embodiments, the sensor portion 10 is configured to detect acceleration or angular rate in a direction parallel to the surface 10a of the sensor portion 10. The sensor portion 10 of the first to fourth embodiments can be replaced with the sensor portion 10 of the fifth to seventh embodiments. Also, the sensor portion 10 of the fifth to seventh embodiments can be replaced with the sensor portion 10 of the first to fourth embodiments.

In the embodiments, the back side 52 of the cap wafer 50 is removed by forming the ion-implanted layer 55 in the cap wafer 50, by mechanically polishing the back side 52, by polishing the back side 52 by CMP, or by etching the back side 52. These methods can be combined. For example, after the through electrode 25c or the cavity region 19b is exposed through the back side 52 of the cap wafer 50 by forming the ion-implanted layer 55 in the cap wafer 50, the new surface of the back side 52 can be polished to a mirror finish by CMP.

Figure 15:
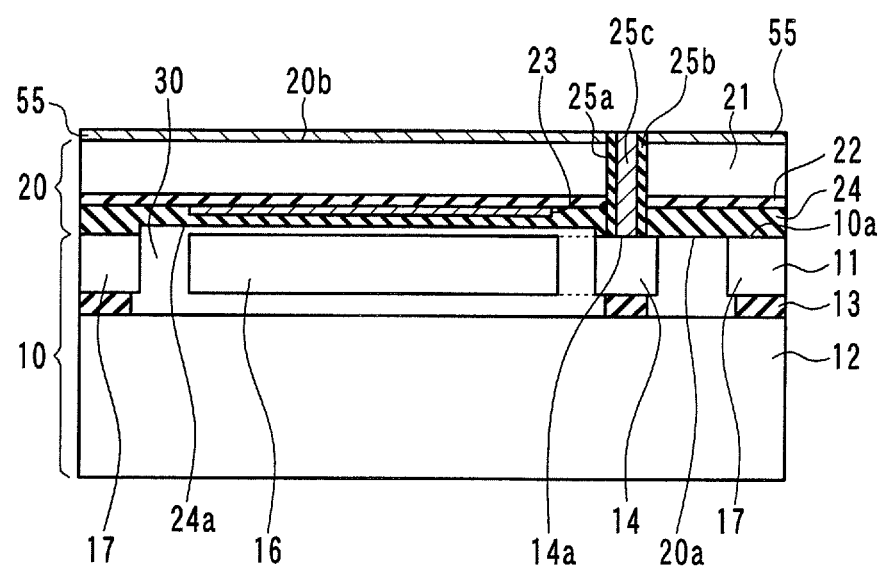
FIG. 15 is a diagram illustrating a cross-sectional view of a semiconductor device according to a modification of the embodiments.

In the first embodiment, the ion-implanted layer 55 has a small thickness that allows the ion-implanted layer 55 to be completely removed when the back side 52 of the cap wafer 50 is removed with respect to the ion-implanted layer 55. Therefore, as shown in FIG. 1B, the ion-implanted layer 55 does not remain in the cap wafer 50. Alternatively, the ion-implanted layer 55 can have a large thickness that prevents the ion-implanted layer 55 from being completely removed. In such a approach, as shown in FIG. 15, the ion-implanted layer 55 can remain on the cap portion 20. In this case, a surface of the ion-implanted layer 55 is a cleavage surface.

Figure 16A:
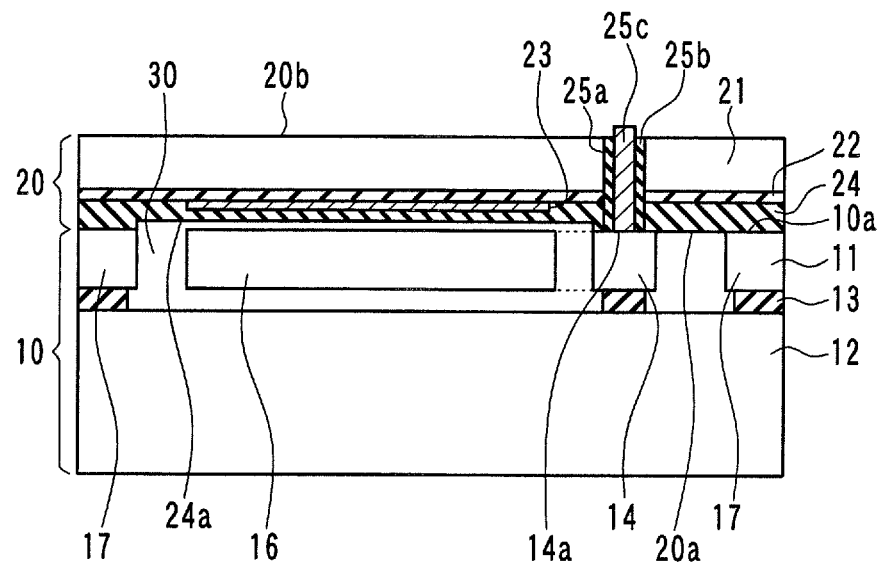
FIG. 16A is a diagram illustrating a cross-sectional view of a semiconductor device according to another modification of the embodiments.

In the first embodiment, the through electrode 25c in the cap portion 20 is exposed to the second surface 20b of the cap portion 20 in such a manner that the tip (i.e., the exposed surface) of the through electrode 25c can be at the same level as the second surface 20b. Alternatively, as shown in FIG. 16A, the through electrode 25c can project from the second surface 20b of the cap portion 20. The structure shown in FIG. 16A can be obtained in the process shown in FIG. 5A by forming the ion-implanted layer 55 at a depth greater than the bottom of the trench 53 measured from the back side 52 of the cap wafer 50. Specifically, ions are not implanted into the buried electrode 54, because the buried electrode 54 is made of metal. Therefore, when the ion-implanted layer 55 is formed at the depth greater than the bottom of the trench 53, the buried electrode 54 projects with respect to the ion-implanted layer 55. Therefore, the through electrode 25c can project with respect to the new surface of the back side 52 of the cap wafer 50 by removing the back side 52 with respect to the ion-implanted layer 55. In this case, there is a possibility that the insulation layer 25b may remain on the exposed surface of the through electrode 25c. The remaining insulation layer 25b can be removed by etching or the like. The structure shown in FIG. 16A can facilitate wire bonding.

Figure 16B:
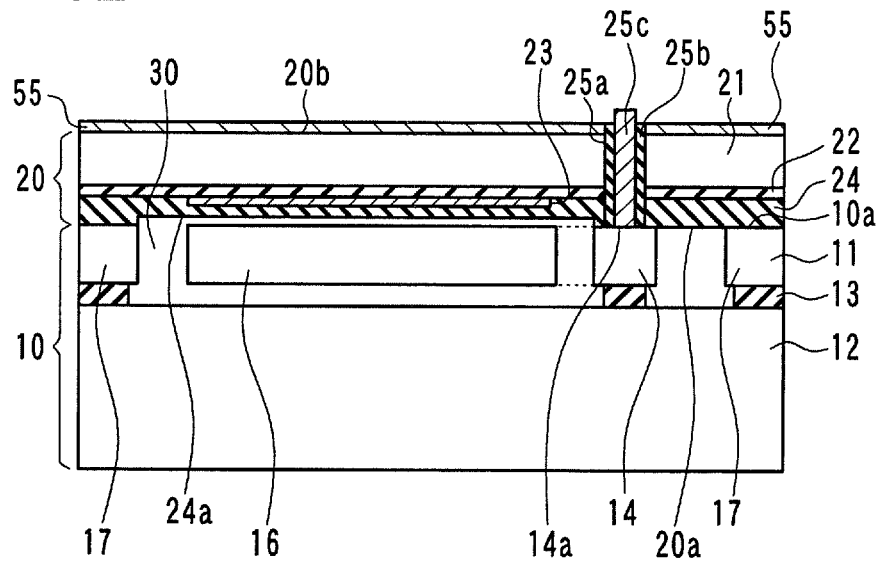
FIG. 16B is a diagram illustrating a cross-sectional view of a semiconductor device according to another modification of the embodiments.

Further, as shown in FIG. 16B, the structure shown in FIG. 15 and the structure shown in FIG. 16A can be combined. Specifically, the structure shown in FIG. 16B can be obtained by forming a thick ion-implanted layer 55 at a depth greater than the bottom of the trench 53 measured from the back side 52 of the cap wafer 50. In such an approach, as shown in FIG. 16B, the ion-implanted layer 55 remains on the second surface 20b of the cap portion 20, and the through electrode 25c projects from the cleavage surface of the remaining ion-implanted layer 55.

As described above, the exposed surface of the through electrode 25c can project with respect to the second surface 20b of the cap portion 20. Alternatively, the exposed surface of the through electrode 25c can be recessed with respect to the second surface 20b of the cap portion 20. For example, the through electrode 25c that is recessed with respect to the second surface 20b can be formed by selectively etching only the through electrode 25c.

Figure 17:
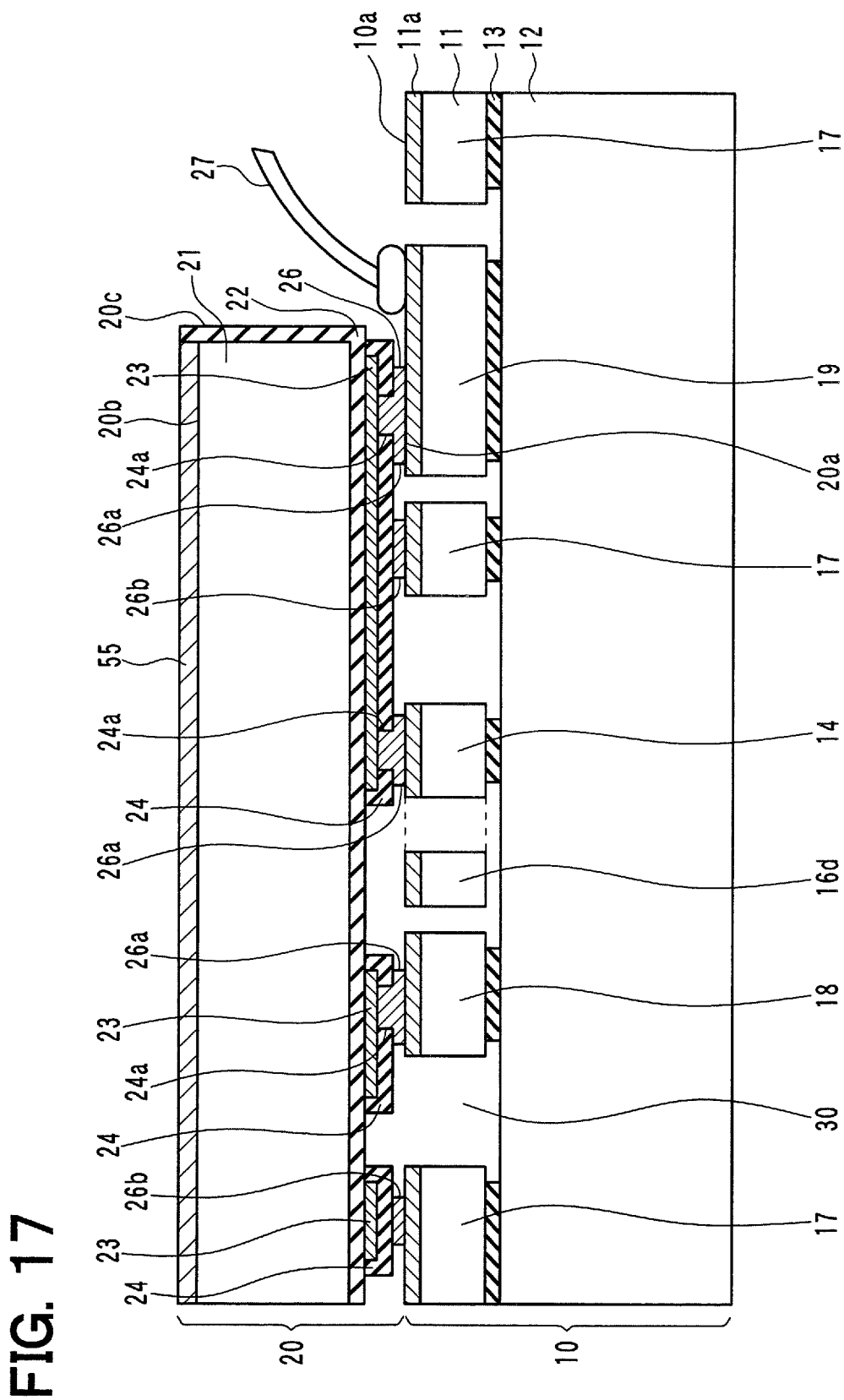
FIG. 17 is a diagram illustrating a cross-sectional view of a semiconductor device according to another modification of the embodiments.

As a modification of the fifth embodiment, in the process shown in FIG. 11B, the ion-implanted layer 55 can be formed in the cap wafer 50 at a depth greater than the bottom of the recessed portion 56 measured from the back side 52 of the cap wafer 50. In this case, ions reach the wiring layer 11a by passing through the cap wafer 50. However, since the ions are blocked by the wiring layer 11a that is made of metal, the connection portion 19 is not affected by the ions. In such an approach, as shown in FIG. 17, the ion-implanted layer 55 can remain on the second surface 20b of the cap portion 20.

As shown in, for example, FIG. 8, according to the fifth to seventh embodiments, the semiconductor device is electrically connected to external circuitry by connecting the wire 27 to the connection portion 19 exposed through the cap portion 20. Alternatively, the semiconductor device can be electrically connected to external circuitry by forming a through electrode in the cap portion 20, by connecting the through electrode to the sensor structure and the peripheral portion 17, and by connecting the wire 27 to the through electrode. In such an approach, the connection portion 19 can be made unnecessary. Thus, the semiconductor device can be reduced in size in a surface direction of the surface 10a of the sensor portion 10. Accordingly, the total size of the semiconductor device is reduced.

A signal processing circuit for processing the capacitance change can be integrated into the semiconductor device. That is, the semiconductor device can be fabricated as an integrated circuit (IC) in which a sensor structure for detecting a physical quantity and a signal processing circuit for processing the detected physical quantity are integrated. In this case, an output signal of the signal processing circuit can be transmitted to external circuitry through the through electrode 25c.

Such changes and modifications are to be understood as being within the scope of the present invention as defined by the appended claims.

What is claims:

1. A method of making a semiconductor device comprising:
   preparing a sensor wafer having one side and including a plurality of sensor portions, each sensor portion having one surface on the one side of the sensor wafer and including a sensor structure at a surface portion of the surface;
   preparing a cap wafer having a front side and a back side opposite to the front side, the cap wafer including a plurality of cap portions, each cap portion having a cover surface on the front side of the cap wafer and a second surface on the back side of the cap wafer;
   forming a wiring layer on the cover surface of the cap portion;
   forming a cover insulation layer on the first surface of the cap portion to cover the wiring layer on an upper surface and side surfaces;
   forming a trench on the first surface of the cap portion;
   forming a trench wall insulation layer on a wall of the trench;
   forming a buried electrode on the trench wall insulation layer;
   joining the one side of the sensor wafer to the front side of the cap wafer together with the wiring layer facing the sensor structure through the cover insulation layer, the buried electrode of the cap portion electrically connecting to a contact region of the sensor structure of the sensor portion and sealing the sensor structure between the sensor portion and the cap portion;
   removing the back side of the cap wafer until the trench and the buried electrode are exposed to a new surface of the back side of the cap wafer and forming a through hole and a through electrode extending from the first surface to the second surface of the cap portion; and
   dividing a joined body of the sensor wafer and the cap wafer into a plurality of semiconductor devices in the form of chips after the forming of the through electrode.

2. The method according to claim 1, wherein
   the removing the back side of the cap wafer until the buried electrode is exposed to the new surface of the back side of the cap wafer includes:
   forming an ion-implanted layer in the cap wafer by implanting a plurality of ions into the back side of the cap wafer, the ion-implanted layer being located at a depth equal to or greater than a bottom of the trench measured from the back side of the cap wafer;
   thermally treating the joined body of the sensor wafer and the cap wafer after the forming of the ion-implanted layer; and
   separating the back side of the cap wafer with respect to the ion-implanted layer as a cleavage surface, so that the buried electrode is exposed to the new surface of the back side of the cap wafer.

3. The method according to claim 1, wherein
   the removing the back side of the cap wafer until the buried electrode is exposed to the new surface of the back side of the cap wafer includes:
   mechanically polishing the back side of the cap wafer.

4. The method according to claim 1, wherein
   the removing the back side of the cap wafer until the buried electrode is exposed to the ne surface of the back side of the cap wafer includes:
   chemically polishing the back side of the cap wafer.

5. The method according to claim 1, wherein
the removing the back side of the cap wafer until the buried electrode is exposed to the new surface of the back side of the cap wafer includes:
etching the back side of the cap wafer, 6. The method according to claim 1, wherein the forming of the cover insulation layer includes forming a recess in the cover insulation layer at a position facing the wiring layer.

7. The method according to claim 6, wherein the sensor structure includes an oscillator, 8. The method according to claim 7, further comprising:
forming an under insulation layer on the first surface of the cap portion, wherein
the wiring layer is formed on the first surface of the cap portion on the under insulation layer, 9. A method of making a semiconductor device comprising steps of:
(A) preparing a sensor wafer having one side and including a plurality of sensor portions, each sensor portion having one surface on the one side of the sensor wafer and including a sensor structure at a surface portion of the surface;
(B) preparing a cap wafer having a front side and a back side opposite to the front side, the cap wafer including a plurality of cap portions, each cap portion having a first surface on the front side of the cap wafer and a second surface on the back side of the cap wafer;
(C) forming a wiring layer on the first surface of the cap portion;
(D) forming a cover insulation layer on the first surface of the cap portion and covering the wiring layer on an upper surface and side surfaces:
(E) forming a trench on the first surface of the cap portion;
(F) forming a trench wall insulation layer on a wall of the trench;
(G) forming a buried electrode on the trench wall insulation layer;
(H) joining the one side of the sensor wafer to the front side of the cap wafer together with interposing the cover insulation between the wiring layer and the sensor structure, electrically connecting the buried electrode of the cap portion to a contact region of the sensor structure of the sensor portion and sealing the sensor structure between the sensor portion and the cap portion;
(I) removing the backside of the cap wafer and exposing a new surface including the trench and the buried electrode and forming a through hole and a through electrode extending from the first surface to the second surface of the cap portion; and
(J) dividing a joined body of the sensor wafer and the cap wafer into a plurality of semiconductor devices in the form of chips after the forming of the through electrode.

10. The method according to claim 9, wherein step (I) includes:
forming an ion-implanted layer in the cap wafer by implanting a plurality of ions into the back side of the cap wafer, the ion-implanted layer being located at a depth equal to or greater than a bottom of the trench measured from the back side of the cap wafer;
thermally treating the joined body of the sensor wafer and the cap wafer after the forming of the ion-implanted layer; and
separating the back side of the cap wafer with respect to the ion-implanted layer as a cleavage surface and exposing the buried electrode at the new surface of the back side of the cap wafer, 11. The method according to claim 9, wherein step (I) includes mechanically polishing the back side of the cap wafer until the buried electrode is exposed to the new surface of the back side of the cap wafer.

12. The method according to claim 9, wherein step (I) includes polishing the back side of the cap wafer by chemical polishing until the buried electrode is exposed at the new surface of the back side of the cap wafer.

13. The method according to claim 9, wherein step (I) includes etching the back side of the cap wafer until the buried electrode is exposed at the new surface of the back side of the cap wafer.

14. The method according to claim 9, wherein step (D) includes forming a recess in the cover insulation layer at a position facing the wiring layer.

15. The method according to claim 14, wherein the sensor structure includes an oscillator.

16. The method according to claim 15, further comprising a step of forming an under insulation layer on the first surface of the cap portion, wherein the wiring layer is formed on the first surface of the cap portion on the second insulation layer.

* * * * *